United States Patent
George et al.

(10) Patent No.: US 11,565,936 B2
(45) Date of Patent: Jan. 31, 2023

(54) ATOMIC LAYER ETCHING ON MICRODEVICES AND NANODEVICES

(71) Applicants: THE REGENTS OF THE UNIVERSITY OF COLORADO, Denver, CO (US); DRS NETWORK & IMAGING SYSTEMS, LLC, Dallas, TX (US)

(72) Inventors: Steven M. George, Boulder, CO (US); Victor M. Bright, Boulder, CO (US); Joseph J. Brown, Honolulu, HI (US); Jonas Gertsch, Boulder, CO (US); Nathan Thomas Eigenfeld, Boulder, CO (US); George Skidmore, Richardson, TX (US)

(73) Assignees: The Regents of the University of Colorado, Denver, CO (US); DRS Network & Imaging Systems, LLC, Dallas, TX (US)

( * ) Notice: Subject to any disclaimer, the term of this patent is extended or adjusted under 35 U.S.C. 154(b) by 561 days.

(21) Appl. No.: 16/303,612

(22) PCT Filed: May 25, 2017

(86) PCT No.: PCT/US2017/034532
§ 371 (c)(1),
(2) Date: Nov. 20, 2018

(87) PCT Pub. No.: WO2017/205658
PCT Pub. Date: Nov. 30, 2017

(65) Prior Publication Data
US 2020/0316645 A1    Oct. 8, 2020

Related U.S. Application Data

(60) Provisional application No. 62/341,394, filed on May 25, 2016.

(51) Int. Cl.
B81C 1/00 (2006.01)
B05D 7/24 (2006.01)
(Continued)

(52) U.S. Cl.
CPC ............ B81C 1/00531 (2013.01); B05D 7/24 (2013.01); B82Y 40/00 (2013.01); C23C 16/01 (2013.01);
(Continued)

(58) Field of Classification Search
None
See application file for complete search history.

(56) References Cited

U.S. PATENT DOCUMENTS 6,690,014 B1    2/2004  Gooch et al.
7,416,989 B1 *  8/2008  Liu .................. H01L 21/02063
                                                    438/706
(Continued)

FOREIGN PATENT DOCUMENTS

WO    WO2016204757    * 12/2016  ......... H01L 21/3065

OTHER PUBLICATIONS

Y. Lee and S.M. George, Atomic Layer Etching of Al2O3 Using Sequential, Self-Limiting Thermal Reactions with Sn(acac)2 and Hydrogen Fluoride, ACS Nano, vol. 9, pp. 2061-2070. (Year: 2015).*

(Continued)

*Primary Examiner* — Jiong-Ping Lu
(74) *Attorney, Agent, or Firm* — Saul Ewing LLP; Kathryn Doyle; Domingos J. Silva

(57) ABSTRACT

The present invention relates to the unexpected discovery of novel methods of preparing nanodevices and/or microdevices with predetermined patterns. In one aspect, the meth- (Continued)

ods of the invention allow for engineering structures and films with continuous thickness equal to or less than 50 nm.

17 Claims, 8 Drawing Sheets

(51) Int. Cl.
| | |
|---|---|
| *C23C 16/01* | (2006.01) |
| *C23C 16/40* | (2006.01) |
| *C23C 16/455* | (2006.01) |
| *H01L 21/311* | (2006.01) |
| *H01L 21/3065* | (2006.01) |
| *B82Y 40/00* | (2011.01) |

(52) U.S. Cl.
CPC ...... *C23C 16/403* (2013.01); *C23C 16/45555* (2013.01); *H01L 21/3065* (2013.01); *H01L 21/30655* (2013.01); *H01L 21/311* (2013.01); *H01L 21/31122* (2013.01); *H01L 21/31144* (2013.01)

(56) References Cited

U.S. PATENT DOCUMENTS

| | | |
|---|---|---|
| 2006/0292877 A1 | 12/2006 | Lake et al. |
| 2014/0273492 A1 | 9/2014 | Anthis et al. |
| 2015/0162214 A1 | 6/2015 | Thompson et al. |
| 2015/0270140 A1* | 9/2015 | Gupta ............... H01L 21/32136 216/67 |
| 2016/0111294 A1 | 4/2016 | Lill et al. |

OTHER PUBLICATIONS

Kanarik, et al., "Overview of Atomic Layer Etching in the Semiconductor Industry," J Vac Sci Technol A, vol. 33(2), 2015, pp. 1-14.
Lee, et al., "Atomic Layer Etching of Al2O3 Using Sequential, Self-Limiting Thermal Reactions with Sn(acac)2 and Hydrogen Fluoride," ACS Nano, vol. 9, No. 2, 2015, pp. 2061-2070.
International Search Report & Written Opinion for PCT International Application No. PCT/US2017/034532 dated Nov. 3, 2017.

* cited by examiner a) 16 hrs at 200 °C, no ALE

___ 2μm b) 67 cycles Sn(acac)₂/HF at 200 °C (higher etch rate)

10 μm c) 16 hrs at 300 °C, no ALE

___ 2μm d) 51 cycles TMA/HF at 300 °C

___ 2μm

10μm

10 μm a) 51 cycles TMA/HF at 300 °C, 0.6 Å/cycle b) 157 cycles TMA/HF at 300 °C, 0.4 Å/cycle c) 100 cycles TMA/HF at 300 °C, 0.75 Å/cycle 1.32 nm $Al_2O_3$

ATOMIC LAYER ETCHING ON MICRODEVICES AND NANODEVICES

CROSS-REFERENCE TO RELATED APPLICATIONS

The present application is a 35 U.S.C. § 371 national phase application of, and claims priority to, International Application No. PCT/US2017/034532, filed May 25, 2017, which claims priority under 35 U.S.C. § 119(e) to U.S. Provisional Patent Application No. 62/341,394, filed May 25, 2016, all of which-applications are hereby incorporated herein by reference in their entireties.

STATEMENT REGARDING FEDERALLY SPONSORED RESEARCH OR DEVELOPMENT

This invention was made with government support under grant number W911NF-14-C-0007 awarded by the U.S. Army Research Office. The government has certain rights in the invention.

BACKGROUND OF THE INVENTION

Micro-electromechanical systems (MEMS) devices comprise components between about 1-100 μm in size (i.e., 0.001-0.1 mm), and MEMS devices generally range in size from 20 μm to 1.0 mm. Such devices can be prepared using modified semiconductor device fabrication technologies, which are commonly used to make electronics. Patterning of the device is usually achieved using techniques such as lithography, photolithography, etching processes (e.g., wet etching using, for example, potassium hydroxide, tetramethylammonium hydroxide, or hydrogen fluoride; dry etching using, for example, vapor etching with xenon difluoride or hydrogen fluoride, or plasma etching), electrodischarge machining, and other technologies capable of manufacturing small devices.

Nano-electromechanical systems (NEMS) devices comprise components that have at least one dimension less than about 1 μm in size. Many of these devices have been carbon based, specifically diamond, carbon nanotubes and graphene. Key problems preventing the commercial application of nano-electromechanical devices have included low-yields, high device quality variability and general difficulties in material compatibility with current nanofabrication methods.

Atomic layer deposition (ALD) uses automated cycling of component gases to deposit solid materials conformally on solid surfaces. The growth of individual layers is a self-limiting reaction, resulting in linear growth of material, which is dependent upon the number of cycles to which a substrate is exposed. ALD allows thickness control and conformality unmatched by any other available industrial process. Moreover, ALD processes generally employ low temperatures, with typical deposition temperatures below 200° C. ALD materials currently available include ceramics ($Al_2O_3$, TaN, $SiO_2$, $HfO_2$, MgO, MnO), metals (W, Pt, Ru), semiconductors (ZnO, AlN), and various other inorganic materials. In the case where ALD processes generate amorphous polymer structures through sequential reactions that include organic molecules, this process is called molecular layer deposition (MLD), and allows controlled conformal deposition of an additional range of materials. In many cases, ALD forms smooth, continuous films only after a number of nucleation cycles. This "nucleation period" varies from substrate to substrate, each of which having a minimum thickness for the formation of a continuous film layer. In many cases, ALD forms continuous films only after tens of cycles, thus precluding engineering of conformal films thinner than a few nanometers. For example, W ALD requires about 10 cycles of nucleation on $SiO_2$, but only a few cycles on $Al_2O_3$ to start growing. It shows linear growth, and should be pinhole free at about 2 nm (about 10 cycles) on $Al_2O_3$. On H-passivated Si, metal oxide films can take tens of cycles before reaching a linear growth regime ($ZrO_2$: 50-60 cycles, $HfO_2$: 25-30 cycles).

There is a need in the art for novel methods of preparing nanodevices and/or microdevices. Such methods should allow for preparation of devices with specific structures and/or predetermined patterns. The present invention meets this need.

BRIEF SUMMARY OF THE INVENTION

The invention provides methods of generating a microdevice or nanodevice ("micro/nanodevice") comprising a first solid material layer. The invention further provides methods of smoothing surfaces on a micro/nanodevice using ALE. The invention further provides methods of reducing a feature size of a 3D architecture on a micro/nanodevice using ALE. The invention further provides micro/nanodevices comprising an exposed solid material layer. The invention further provides micro/nanodevices that have been smoothed using ALE. The invention further provides micro/nanodevices wherein at least one feature size of a 3D architecture thereof has been reduced using ALE.

In certain embodiments, the invention provides a microdevice or nanodevice comprising an exposed solid material layer that has an approximately uniform thickness of ≤50 nm. In other embodiments, the invention provides a microdevice or nanodevice comprising an exposed solid material layer that has an approximately uniform length and/or width of ≥1 μm.

In certain embodiments, the microdevice or nanodevice is an absorbing mechanism for a microbolometer. In other embodiments, the microdevice or nanodevice is a bolometer, transducer, temperature sensor, heater, thermistor, microbolometer, microphone, speaker, ultrasonic transducer, resistor, inductor, spiral inductor, mechanical actuator, flagellum, flagellum motor, freestanding nanodevice, freestanding microdevice, Bragg reflector, Bragg filter, antenna, terahertz detector, electromagnetic transformer, or electrical system. In yet other embodiments, the microdevice or nanodevice is a transistor, via, conduit, and any other electrical circuit components, Josephson junction, superconducting device, electrical conductor, photovoltaic, transistor, diode, waveguide, electrical transmission line, light emitting diode, thermocouple, mirror, absorber for photons (e.g. infrared, terahertz, x-ray, gamma-ray, ultraviolet, visible light), photon emitter (e.g. infrared, terahertz, x-ray, gamma-ray, ultraviolet, visible light), radiation shield (e.g. electromagnetic or ionizing), or radiation detector (e.g. electromagnetic or ionizing). In yet other embodiments, the microdevice or nanodevice is a nanotube, nanowire, coaxial wire, hollow tube with nanoscale diameters, periodic structure, or metamaterial.

In certain embodiments, the bolometer of the invention has low thermal time constant, such as, in a non-limiting example, ≤10 ms. In other embodiments, the bolometer of the invention has sheet resistance about ≤150 ohm/sq. In yet other embodiments, the bolometer of the invention has curl about ≤250 nm.

In certain embodiments, the method comprises providing a solid supporting material layer, wherein at least a portion of a surface of the solid supporting material layer is attached to a first solid material layer. In other embodiments, the method comprises performing ALE on at least one exposed surface of the first solid material layer.

In certain embodiments, the micro/nanodevice's first solid material layer has an approximately uniform thickness of ≤50 nm. In other embodiments, the thickness is selected from the group consisting of ≤40 nm, ≤30 nm, ≤20 nm, ≤10 nm, ≤8 nm, ≤6 nm, ≤4 nm, ≤2 nm, and ≤1 nm. In yet other embodiments, the micro/nanodevice's first solid material layer has length and/or width that is/are independently selected from the group consisting of ≥1 µm, ≥2 µm, ≥4 µm, ≥6 µm, ≥8 µm, ≥10 µm, ≥20 µm, ≥40 µm, ≥60 µm, ≥80 µm, and ≥100 µm.

In certain embodiments, at least a portion of the first solid material layer is fabricated using a procedure selected from the group consisting of atomic layer deposit (ALD), micromachining, molecular layer deposition (MLD), reactive ion beam deposition, chemical vapor deposition, sputtering, evaporation, sol-gel processing, electroplating, photopolymerization, three-dimensional (3D) printing, spin coating, spray coating, contact adhesion, casting, self-assembly, dip-coating, Langmuir-Blodgett deposition, and plasma enhanced chemical vapor deposition.

In certain embodiments, the first solid material layer comprises two or more at least partially overlapping layers. In other embodiments, the first solid material layer comprises three at least partially overlapping layers. In yet other embodiments, at least one of the two or more at least partially overlapping layers is not significantly etched by ALE.

In certain embodiments, at least a portion of the first solid material layer is at least partially attached to the solid supporting material layer through an intervening material layer. In other embodiments, at least one selected from the group consisting of the solid supporting material layer and the intervening material layer is not significantly etched by ALE.

In certain embodiments, the first solid material layer is deposited onto the solid supporting material layer and/or intervening material layer using at least one method selected from the group consisting of ALD, MLD, reactive ion beam deposition, chemical vapor deposition, sputtering, evaporation, sol-gel processing, electroplating, photopolymerization, 3D printing, spin coating, spray coating, contact adhesion, casting, self-assembly, dip-coating, Langmuir-Blodgett deposition, and plasma enhanced chemical vapor deposition.

In certain embodiments, the intervening material layer is deposited onto the solid supporting material layer using at least one method selected from the group consisting of ALD, MLD, reactive ion beam deposition, chemical vapor deposition, sputtering, evaporation, sol-gel processing, electroplating, photopolymerization, 3D printing, spin coating, spray coating, contact adhesion, casting, self-assembly, dip-coating, Langmuir-Blodgett deposition, and plasma enhanced chemical vapor deposition.

In certain embodiments, the first solid material layer comprises at least one material selected from the group consisting of Ag, Al, $Al_2O_3$, Au, Co, Cu, Fe, GaN, Ge, $GeO_2$, $HfO_2$, indium tin oxide, Ir, Mo, Ni, Pd, Pt, Rh, Ru, Ru, $RuO_2$, Si, SiC, SiGe, $SiO_2$, $SnO_2$, Ta, Ti, TiN, $TiO_2$, $V_2O_5$, $VO_x$, W, ZnO, $ZrO_2$, parylene, polyimide, polymethyldisiloxane, polystyrene, polypropylene, poly(methyl methacrylate), polyethylene, an epoxy, and poly(vinyl chloride).

In certain embodiments, the nanodevice or microdevice is at least partially freestanding. In other embodiments, at least a portion of the intervening solid material layer is further removed. In yet other embodiments, upon removal of at least a portion of the intervening solid material layer, at least a portion of the ALE-treated first solid material layer does not contact (is suspended over) the solid supporting material layer.

In certain embodiments, before ALE is performed on at least one exposed surface of the first solid material layer, the method comprises masking at least a portion of the exposed surface of the first solid material layer. In other embodiments, before ALE is performed on at least one exposed surface of the first solid material layer, the method comprises coating the exposed surface of the first solid material layer with an ALE-resistant material, and then etching the ALE-resistant material, so as to expose at least a portion of the surface of the first solid material layer. In yet other embodiments, the etching is anisotropic.

In certain embodiments, the solid supporting material layer comprises Si, $SiO_2$, SiGe, Pyrex, $Si_3N_4$, sapphire, GaAs, SiC, metal, insulator, semiconductor, or solid organic material (such as, but not limited to, polyimide). In other embodiments, the solid supporting material layer is a wafer. In yet other embodiments, the wafer comprises Si, $SiO_2$, SiGe, Pyrex, $Si_3N_4$, sapphire, GaAs, SiC, metal, insulator, semiconductor, or solid organic material.

In certain embodiments, the masking comprises at least one selected from the group consisting of photolithography, electron-beam (e-beam) lithography, nanoimprint lithography, x-ray lithography, a hard mask comprising an organic material, and a hard mask comprising an inorganic material layer. In other embodiments, the masking or anisotropic etching allows for the ALE to form a cavity within the first solid material layer. In yet other embodiments, the masking exposes a section of the surface of the first solid material layer.

In certain embodiments, ALE is performed to form a cavity that is located on the surface of the exposed first solid material layer and is approximately hemi-spherical. In other embodiments, removal of at least a portion of the intervening solid material layer forms a curved surface in the nanodevice or microdevice. In yet other embodiments, the anisotropic etching creates an indentation within the first solid material layer. In yet other embodiments, the surface of the indentation is further partially coated with an ALE-resistant material, such that at least a portion of the surface of the indentation is exposed. In yet other embodiments, ALE is performed to form a cavity that is located within the first solid material layer and is approximately spherical. In yet other embodiments, the ALE-treated first solid material layer is further coated. In yet other embodiments, the coating is performed using at least one method selected from the group consisting of ALD, MLD, reactive ion beam deposition, chemical vapor deposition, sputtering, evaporation, sol-gel processing, electroplating, photopolymerization, 3D printing, spray coating, contact adhesion, casting, self-assembly, dip-coating, Langmuir-Blodgett deposition, and plasma enhanced vapor deposition.

In certain embodiments, the first solid material layer comprises a first metal-containing material. In other embodiments, the ALE comprises: (a) contacting the exposed first solid material layer with a gaseous second metal-containing precursor, wherein the second metal-containing precursor comprises at least one ligand selected from the group consisting of a monodentate ligand, chelate and any combinations thereof, whereby a first metal-containing precursor is formed. In yet other embodiments, the ALE comprises: (b) contacting the material formed in step (a) with a halogen-containing gas, whereby a first metal halide is formed. In yet other embodiments, the ALE comprises: (c) optionally repeating steps (a) and (b) one or more times. In yet other embodiments, in at least one time point selected from the group consisting of: during step (a), inbetween step (a) and step (b), during step (b), and inbetween step (b) and step (a) of the following iteration, the exposed first solid material layer is treated with an agent that promotes removal of at least a fraction of any ligand, or any residual surface species that results from a surface reaction, that is bound to and/or adsorbed onto the exposed first solid material layer.

In certain embodiments, the monodentate ligand comprises at least one selected from the group consisting of alkyl, hydride, carbonyl, halide, alkoxide, alkylamide, silylamide and any combinations thereof. In other embodiments, the chelate comprises at least one selected from the group consisting of β-diketonate, amidinate, acetamidinate, β-diketiminate, diamino alkoxide, metallocene and any combinations thereof.

In certain embodiments, step (a) and/or step (b) is/are performed at a temperature that is equal to or greater than a value ranging from about 25° C. to about 450° C. In other embodiments, the gaseous compound of the second metal in step (a) and the halogen-containing gas in step (b) are contained in separate systems, and the nanodevice or microdevice is physically moved from one system to the other.

In certain embodiments, the first metal-containing material comprises at least one selected from the group consisting of metal oxide, metal nitride, metal phosphide, metal sulfide, metal arsenide, metal fluoride, metal silicide, metal boride, metal carbide, metal selenide, metal telluride, elemental metal, metal alloy, hybrid organic-inorganic material, and any combinations thereof. In other embodiments, before step (a) takes place, the elemental metal is converted to the corresponding metal halide.

In certain embodiments, the exposed first solid material layer is first submitted to a chemical treatment that results in the formation, on at least a portion of the surface of the exposed first solid material layer, of a metal-containing material selected from the group consisting of a metal oxide, metal nitride, metal phosphide, metal sulfide, metal arsenide, metal fluoride, metal silicide, metal boride, metal carbide, metal selenide, metal telluride, elemental metal, metal alloy, hybrid organic-inorganic material, and any combinations thereof.

In certain embodiments, the first metal comprises at least one selected from the group consisting of Al, Hf, Zr, Fe, Ni, Co, Mn, Mg, Rh, Ru, Cr, Si, Ti, Ga, In, Zn, Pb, Ge, Ta, Cu, W, Mo, Pt, Cd, Sn and any combinations thereof. In other embodiments, the second metal comprises at least one selected from the group consisting of Sn, Ge, Al, B, Ga, In, Zn, Ni, Pb, Si, S, P, Hf, Zr, Ti and any combinations thereof.

In certain embodiments, the β-diketonate comprises at least one selected from the group consisting of acac (acetylacetonate), hfac (hexafluoroacetylacetonate), tfac (trifluoroacetylacetonate), thd (tetramethylheptanedionate) and any combinations thereof.

In certain embodiments, the halogen-containing gas comprises a hydrogen halide. In other embodiments, the hydrogen halide comprises HF, HCl, HBr or HI.

In certain embodiments, the halogen-containing gas comprises at least one selected from the group consisting of $F_2$, $ClF_3$, $NF_3$, $SF_6$, $SF_4$, $XeF_2$, $Cl_2$, $Br_2$, $BCl_3$, $I_2$ and any combinations thereof. In other embodiments, the halogen-containing gas comprises at least one selected from the group consisting of $F_2$, $ClF_3$, $NF_3$, $SF_6$, $SF_4$, $XeF_2$, $Cl_2$, $Br_2$, $BCl_3$, $I_2$, $CF_4$, $CF_2Cl_2$, $CCl_4$, $CF_3Cl$, $C_2F_6$, $CHF_3$ and any combinations thereof, and wherein the halogen-containing gas is ionized in a plasma to produce at least one halogen radical and/or ion. In yet other embodiments, the halogen-containing gas is ionized in a plasma to produce at least one halogen radical and/or ion.

In certain embodiments, the exposed first solid material layer is pretreated by sequentially contacting with a gaseous second metal-containing precursor, and a halogen-containing gas.

BRIEF DESCRIPTION OF THE FIGURES

For the purpose of illustrating the invention, there are depicted in the drawings certain embodiments of the invention. However, the invention is not limited to the precise arrangements and instrumentalities of the embodiments depicted in the drawings.

FIG. 2A: Microbridge with Al contact pads for thermal time constant measurements pre- and post-ALE. FIG. 2B: Microbolometer-type absorption structure made up of $Al_2O_3/W/Al_2O_3$ as fabricated pre-ALE.

FIG. 3A: The $Sn(acac)_2$/HF chemistry corresponded to about 0.022 nm/cycle etch rate. FIG. 3B: The TMA/HF chemistry at 300° C. corresponded to about 0.055 nm/cycle etch rate.

FIG. 2B corresponds to a structure obtained with heating and no ALE. FIG. 5A: control for $Sn(acac)_2$/HF ALE process; no ALE with 16 hours at 200° C. FIG. 5B: 67 cycles of $Sn(acac)_2$/HF. FIG. 5C: control for TMA/HF process; no ALE, but 16 hours at 300° C. FIG. 5D: 51 cycles of TMA/HF. All structures are 16 μm×16 μm and viewed at a tilt in a scanning electron microscope (SEM).

DETAILED DESCRIPTION OF THE INVENTION

Figure 1:
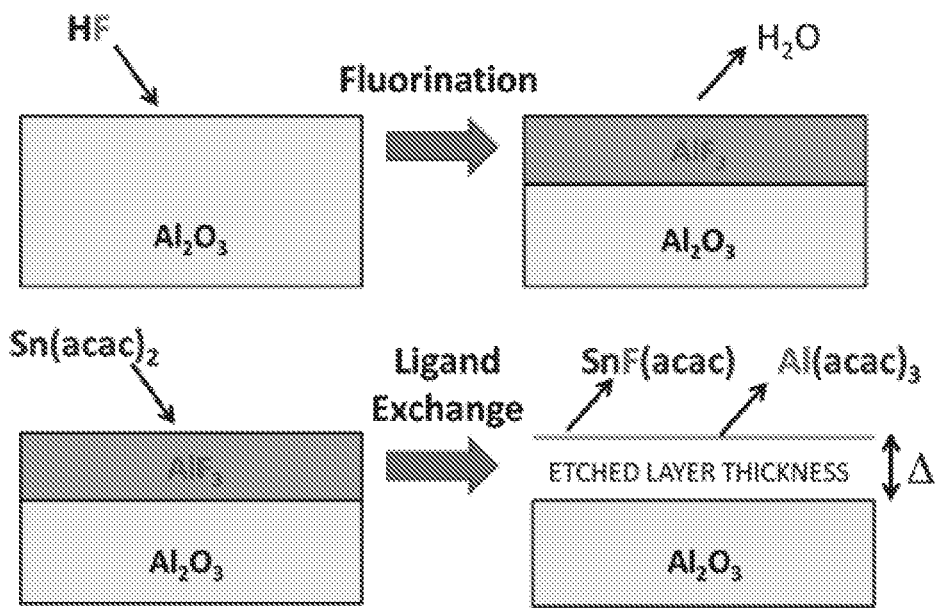
FIG. 1 illustrates a general schematic of $Al_2O_3$ ALE surface chemistry using $Sn(acac)_2$ (tin(II) acetylacetonate) and HF. (Step A) The surface of $Al_2O_3$ is converted to an $AlF_3$ surface layer through a fluorination reaction. (Step B) The metal fluoride layer exchanges ligands with the $Sn(acac)_2$ producing volatile species, which removes the $AlF_3$ surface layer.

The present invention relates to the unexpected discovery of novel methods of preparing nanodevices or microdevices with predetermined patterns. In one aspect, the methods of the invention allow for engineering structures and films with continuous thickness as low as 1-2 Å. As demonstrated herein, atomic layer etching (ALE) was performed on suspended nanodevices, which were fabricated using an atomic layer deposition (ALD) on polyimide process. Two thermal ALE chemistries, including $Sn(acac)_2$/HF and TMA/HF, were used to remove $Al_2O_3$ from suspended microbridges and microbolometer-type absorption structures. Measurement of the thermal time constants of several microbridges after ALE was used to evaluate finite $Al_2O_3$ material removal. ALE can have substantial influence on a wide variety of microdevices. The present disclosure demonstrates ALE's functionality for fabrication of ultra-thin suspended structures.

The last few decades have seen immense advances in micromachining technologies, and the nano/micro-electro-mechanical systems (N/MEMS) industry continues to push forward. As device thicknesses continue to shrink to several nanometers, precise etching processes for successful device fabrication are required. Additionally, the stringent demands of precise tolerances for three-dimensional finFET (Fin Field Effect Transistor) devices require extremely precise, low-damage etching processes. Yet many current material removal techniques, such as milling, reactive-ion etching (RIE), and/or wet etching, are all vulnerable to manufacturing uncertainties at the nanoscale. Current plasma processing approaches expose devices to large particle fluxes causing damage to surfaces. Etch rates of not only the desired material, but also of the underlying and masking films, must be known Over/under-etching can lead to decreased performance or complete loss of functionality. Techniques such as ALE, which is based on sequential, self-limiting surface reactions, allow for a more controlled etch, but the majority of ALE processes reported use excitation methods, such as ion-enhanced or energetic noble gas atom-enhanced reactions, which are not compatible with many N/MEMS devices.

Similar to ALD, thermal ALE provides self-limiting, conformal, and atomically precise layer by layer removal of material through thermodynamically favorable vapor phase reaction cycles. The lower temperature requirements of thermal ALE are highly compatible with N/MEMS systems and commercial electronics manufacturing processes. ALE has been identified as one of the leading low-damage process technologies for transistor development and offers unique opportunities for nanodevice and microdevice fabrication. However, while in principle ALE can be considered as ALD in reverse, it is not a simple reversal of the chemical reactions. Different precursors must be used in the removal of material. The majority of ALE to date (non-thermal ALE) has used ion-enhancement or energetic neutral atom beam enhanced surface reactions together with halogenation of the surface to etch the material. These techniques can lead to anisotropic etching that may not be desirable in some applications.

Thermal ALE can be performed based on spontaneous thermal chemistries. For example, etching of $Al_2O_3$ may be achieved by an initial reactant fluorinating the surface to form a metal fluoride layer. A second metal reactant can then accept fluorine from the metal fluoride and donate a ligand to the metal in the metal fluoride to form volatile species through a ligand-exchange process. For example, the removal of $Al_2O_3$ is achieved using tin(II) acetylacetonate $(Sn(acac)_2)$ and HF as the reactants. The overall reaction is:

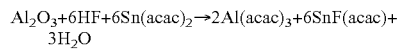

$$Al_2O_3 + 6HF + 6Sn(acac)_2 \rightarrow 2Al(acac)_3 + 6SnF(acac) + 3H_2O$$

A schematic showing the individual $Sn(acac)_2$ and HF reactions is given in FIG. 1. The metal fluoride ligand exchange mechanism for etching can be extended to other chemistries as well, including trimethylaluminum (TMA) and HF.

ALD allows for preparing conformal coatings for three-dimensional (3D) structures. The ability to remove material by single atomic layers conformally on 3D structures also offers extreme control in many etching processes for N/MEMS. As an example, using ALE for microbolometer fabrication allows the removal of excess mass, reducing the total heat capacity and improving sensitivity to absorbed radiation. ALD can be used to prepare a microbolometer-type absorption structure, as well as any structure where it is advantageous to remove redundant material post-release or from complex 3D structures.

As described herein, the present invention uses ALE in a microdevice or nanodevice fabrication process. ALE allows fine control of device patterning and material thicknesses, and allows access to better-controlled material layers than ALD during film deposition.

High Precision

N/MEMS devices often require highly uniform parts to function properly. Even small non-uniformities can result in device failure. Fabrication uncertainties in both deposition and etching can lead to difficulties in reliability and in commercialization of these devices. ALE allows for eliminating much of the uncertainty in etching. For example, ALE can be used in conjunction with ALD to create highly precise gaps less than a few nanometers in size. ALD can be used to create highly uniform and controllable spacing in N/MEMS devices with Ångstrom-level control. ALE can then be used to controllably etch the ALD film, resulting in a highly uniform gap with very low fabrication uncertainty.

Etching Freestanding Structures

Thermal ALE can be used to uniformly and controllably etch suspended, freestanding, or untethered structures (FIG.

4). This allows for precise control and tunability of parameters such as size, thermal mass, curl, and stress at the end of a lithography and suspension process. On untethered solid structures in multiphase flow, ALE provides a precise means to refine or modify these structures in parallel simultaneously across numerous (for example, trillions of) devices.

Figure 12:
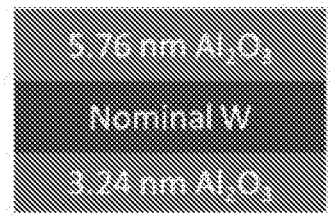
FIG. 12 illustrates progressive removal of ALD $Al_2O_3$ on top/underside of suspended ALD $Al_2O_3$/W/$Al_2O_3$ umbrella (anchored) structure. (a) First step of etching resulting in negligible upwards curling. (b) Second step of etching resulting in notable upwards curling and initiation of "potato chipping". (c) Third step of etching resulting in full curled and "over curled" potato-chipped" structures.
Figure 12:
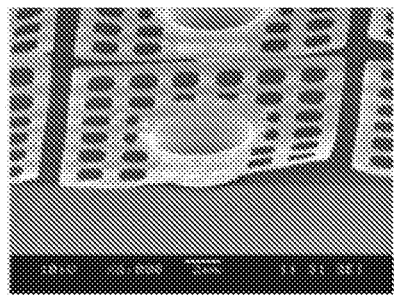
Figure 12:
Figure 12:
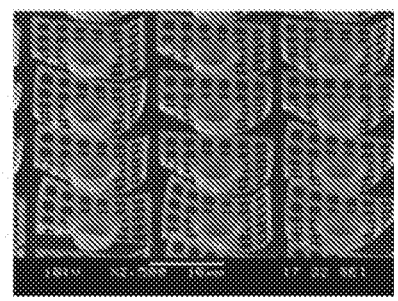
Figure 12:
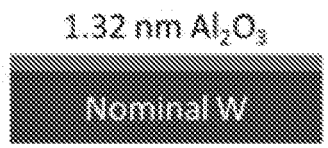
Figure 12:
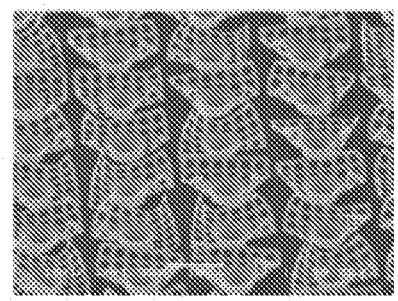

As demonstrated elsewhere herein, suspended fixed-fixed cantilever structures comprising ALD $Al_2O_3/Ru/Al_2O_3$, as well as suspended anchored structures comprising ALD $Al_2O_3/W/Al_2O_3$, can be etched. Suspended anchored structures can be further etched in their freestanding state. FIG. 12 demonstrates three etch steps with progressively more ALD $Al_2O_3$ removal by thermal ALE using trimethylaluminum (TMA) and hydrogen fluoride (HF) at 300° C. Etch rates were varied due to variable precursor pressure, resulting in more or less fluorination of the $Al_2O_3$ surface during the fluorination and ligand exchange process used by thermal ALE of $Al_2O_3$. Progressively more ALD $Al_2O_3$ was removed from the freestanding ALD $Al_2O_3/W/Al_2O_3$ anchored structure, which corresponded to increasing upwards curl of the structure.

Qualitatively, this further confirms removal of $Al_2O_3$ through thermal ALE from suspended ALD $Al_2O_3/W/Al_2O_3$, because these structures have sensitive stress gradients, to within changes on the order of single nm's of ALD $Al_2O_3$. As $Al_2O_3$ is removed, the stress gradient becomes unbalanced resulting in upwards curl. Upon almost complete removal of the ALD $Al_2O_3$ (FIG. 12, panel c) the structures reduce to a "potato-chipped" strain relief state of curled and over −90° curled corners.

Elimination of Over/Under-Etch

Thermal ALE has Angstrom-level control along with high uniformity and can be used to precisely etch a material without over-etching either with or without an etch stop. This provides the following benefits versus other etch processes used in microfabrication and nanofabrication: reduce heat capacity by minimizing thickness of etch stop layers; reduce device failure due to uncontrolled or non-uniform etch processes; increase uniformity and predictability of etching; simplify production steps by eliminating or minimizing etch stop layers.

Mask Layer Undercutting and Atomic Precision Fabrication

Thermal ALE can provide an isotropic etch with Angstrom-level (atomic) precision, and is thus useful for improving the precision of isotropic etches. One example of this is in undercutting of material masked by photo-resist (a soft mask), or another material with high etch selectivity (a hard mask). Because of the precision controlled by the number of ALE cycles, ALE can be used to improve the resolution of fabrication using lithography.

In certain non-limiting embodiments, if lithography can be used to provide a patterned resist, or patterned liftoff mask (metallic or non-metallic), with features that are highly precise in position but whose minimum feature size is 10 nm, subsequent ALE steps can be used to undercut the mask edges by a controlled number of atomic steps. This allows definition of features with widths on the order of Ångstroms. In this sense, the lithography limit is no longer the limiting factor in final device dimensions. This method provides a parallelized fabrication process for generation of ≤1 nm lateral dimensions in a device. This method can be used in combination with any lithographic technique, including but not limited to nanoimprint lithography, e-beam lithography, and photolithography.

Furthermore, use of ALE to enhance precision of lithographic methods allows top-down directed, parallel fabrication at levels of precision that generally are not otherwise possible with any other known process. ALE-enhanced fabrication is inherently a fabrication process that treats large areas simultaneously. Similarly, self-assembled nanoparticles and viruses, among other structures, can form ordered arrays on a surface, and these as well can be used as masks for ALE of the underlying substrate, thereby creating ordered structures in the substrate dependent on the masking array.

Deposit and Etch Back

Thin films often require a period of nucleation before a smooth pinhole-free layer is formed. This is true even for ALD coatings, and can lead to films needing to be thicker than desired in order to have the required film properties for a micro or nano device. ALE can be used in conjunction with a thin film deposition technique, so that films can be grown past their nucleation regime and then etched back to a desired thickness using ALE. This allows for a conformal film of much thinner final thickness than even an ALD process can provide. It can also improve properties, such as electrical conductivity and roughness, of ultra-thin films.

Deposit, Anneal, and Etch Back

Often, thin films require annealing to create a desired film morphology or physical film property. Films ≤10 nm often agglomerate during higher temperature anneals, destroying the overall film structure. By depositing a thicker film (≥10 nm) with various deposition methods (including, but not limited to, chemical vapor deposition, sputtering, evaporation or plasma enhanced vapor deposition, or ALD), it is possible to anneal the film without agglomeration. Thermal ALE can then be utilized to etch the annealed film to sub-10 nm thicknesses. This method offers ultra-thin films (≤10 nm) with superior physical properties than those obtained with a thin film deposition and anneal process.

High Aspect Ratio Etch

ALD is a self-limiting gas phase technique that shows superb conformality in high-aspect ratio structures. Similarly, thermal ALE can be used to uniformly etch high-aspect ratio structures allowing for etch conformality at lower temperatures than currently possible. One non-limiting example is to etch deep vias.

Selective Etching

Figure 5A:
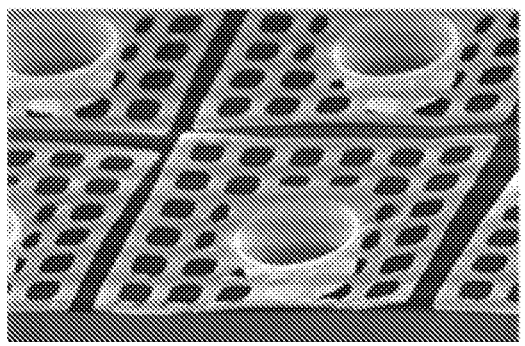
FIGS. 5A-5D illustrate thermal ALE trials on microbolometer-type absorption structures with $Sn(acac)_2$/HF chemistry (FIG. 5B) and TMA (trimethylaluminum)/HF chemistry (FIG. 5D).
Figure 5B:
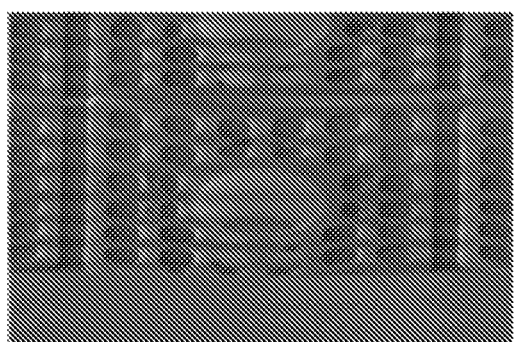
Figure 5C:
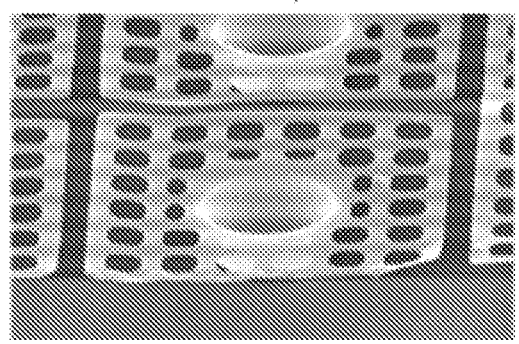
Figure 5D:
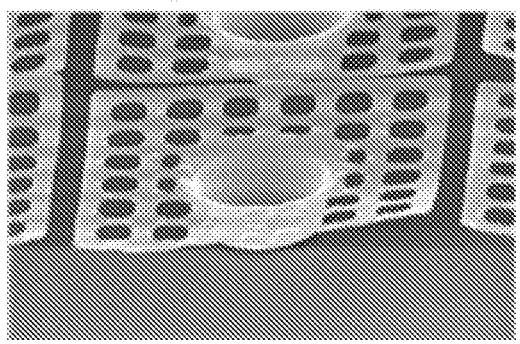

Since ALE consists of self-limiting surface reactions, only certain surfaces can react in such a way that leads to etching. With the correct choice of chemical precursors, extremely high etching selectivity is possible (see FIGS. 5A-5B). For example, subsequent exposures of tin(II) acetylacetonate ($Sn(acac)_2$) and hydrogen fluoride (HF) can be used to etch $Al_2O_3$ films at 200° C. This same chemistry does not, however, etch an ALD W film or ALD Ru film at the same temperature, as evidenced by no mass loss during quartz crystal microbalance (QCM) experiments or metal removal in pre- and post $Al_2O_3$ ALE XRR measurements. Additionally, subsequent exposures of trimethylaluminum (TMA) and HF can be used to etch $Al_2O_3$ films at 300° C. This same chemistry does not, however, etch an ALD W film at the same temperature, as evidenced by pre- and post $Al_2O_3$ ALE XRR measurements.

Definitions

As used herein, each of the following terms has the meaning associated with it in this section.

As used herein, unless defined otherwise, all technical and scientific terms generally have the same meaning as commonly understood by one of ordinary skill in the art to which this invention belongs. Generally, the nomenclature used herein and the laboratory procedures in surface chemistry are those well-known and commonly employed in the art.

As used herein, the articles "a" and "an" refer to one or to more than one (i.e. to at least one) of the grammatical object of the article. By way of example, "an element" means one element or more than one element.

As used herein, "Å" is the abbreviation for "Ångstrom," and 1 Å=1 Ångstrom=0.1 nm=$10^{-10}$ m=0.1 billionth of a meter.

As used herein, the term "about" will be understood by persons of ordinary skill in the art and will vary to some extent on the context in which it is used. As used herein, "about" when referring to a measurable value such as an amount, a temporal duration, and the like, is meant to encompass variations of ±20%, ±10%, ±5%, ±1%, or ±0.1% from the specified value, as such variations are appropriate to perform the disclosed methods.

As used herein, the term "acac" refers to acetylacetonate.

As used herein, the term "ALD" refers to atomic layer deposition, which is a thin film deposition method. In certain embodiments, the term "thin" refers to a range of thickness from about 0.1 nm to about 300 nm. ALD uses a self-limiting reaction sequence that deposits films in discrete steps limited by surface site chemical reactions. ALD produces continuous films with atomically controlled thicknesses, high conformality, and typically pinhole-free and atomically smooth surfaces. These are essential properties as design constraints push device technologies to ever-smaller sizes. In certain embodiments, molecular layer deposition (MLD) is a non-limiting example of ALD. In other embodiments, materials prepared using ALD include materials prepared using MLD. In yet other embodiments, MLD comprises deposition of an alkoxide polymer on a substrate. In yet other embodiments the MLD comprises generation of a polymer by alternating reactions of chemicals selected from a first and a second group; wherein the first group includes but is not limited to trimethylaluminum, titanium tetrachloride, and diethyl zinc; and wherein the second group includes but is not limited to ethylene glycol, propylene glycol, glycerol, hydroquinone, 1,2-ethanedithiol, and 1,3-propanedithiol.

As used herein, the term "ALE" refers to atomic layer etching. The terms "ALE" and "Atomic Layer Etching" as used herein refer to any etching process based on cyclic etching of a substrate by two or more chemical reagents, thereby removing a controlled thickness of the exposed substrate with each cycle of etching. Such processing can thus be accomplished in liquid phase environments, gas environments, or plasma environments, and can apply both to etching of inorganic compounds and to removal of monomers of a polymer or other organic materials.

As used herein, the term "exposed" as applied to a surface refers to the fact that the surface can be contacted with a fluid, such as a gas and/or a liquid.

As used herein, the term "finFET" refers to Fin Field Effect Transistor.

As used herein, the term "instructional material" includes a publication, a recording, a diagram, or any other medium of expression that may be used to communicate the usefulness of the compositions and/or methods of the invention. In certain embodiments, the instructional material may be part of a kit useful for generating a composition and/or performing the method of the invention. The instructional material of the kit may, for example, be affixed to a container that contains the compositions of the invention or be shipped together with a container that contains the compositions. Alternatively, the instructional material may be shipped separately from the container with the intention that the recipient uses the instructional material and the compositions cooperatively. For example, the instructional material is for use of a kit; instructions for use of the compositions; or instructions for use of the compositions.

As used herein, the term "MEMS" refers to a microelectromechanical system.

As used herein, the term "metal chelate" refers to a compound formed between a metal and at least one chelating (or polydentate) ligand. In certain embodiments, the chelating ligand is at least one selected from the group consisting of β-diketonate, thio-β-diketonate, amidinate, acetamidinate, β-diketiminate and (substituted or non-substituted) cyclopentadienyl. In other embodiments, all the chelating ligands in the metal chelate complex are identical (e.g., all groups are β-diketonates). In other embodiments, at least two distinct chelating ligands are present in the chelate.

As used herein, the term "metal precursor" refers to a metal chelate, a metal monodentate complex and any combinations thereof.

As used herein, the term "metal monodentate complex" refers to a compound formed between a metal and at least one monodentate ligand. In certain embodiments, the monodentate ligand is at least one selected from the group consisting of alkyl, hydride, carbonyl (carbon monoxide), halide, alkoxide, alkylamide and silylamide. In other embodiments, all the monodentate ligands in the metal monodentate complex are identical (e.g., all alkyl groups are methyl). In other embodiments, at least two distinct monodentate ligands are present in the monodentate complex (e.g., the alkyl groups comprise methyl and ethyl).

As used herein, "µm" is the abbreviation for "micron" or "micrometer", and 1 µm=0.001 mm=$10^{-6}$ m=1 millionth of a meter.

As used herein, a "nanodevice" refers to a device that has at least one component with at least one spatial dimension less than 1 micron.

As used herein, the term "NEMS" refers to a nanoelectromechanical system.

As used herein, "nm" is the abbreviation for "nanometer" and 1 nm=1 nanometer=$10^{-9}$ m=1 billionth of a meter.

As used herein, the term "QCM" refers to quartz crystal microbalance.

As used herein, the term "RIE" refers to reactive-ion etching.

As used herein, the term "TMA" refers to trimethylaluminum.

As used herein, the term "ultra-thin" as applied to a layer refers to a layer that has thickness equal to or less than ≤100 nm, such as for example ≤50 nm.

As used herein, the term "XRR" refers to X-ray reflectivity.

Throughout this disclosure, various aspects of the invention may be presented in a range format. It should be understood that the description in range format is merely for convenience and brevity and should not be construed as an inflexible limitation on the scope of the invention. Accordingly, the description of a range should be considered to have specifically disclosed all the possible sub-ranges as well as individual numerical values within that range and, when appropriate, partial integers of the numerical values within ranges. For example, description of a range such as from 1 to 6 should be considered to have specifically disclosed sub-ranges such as from 1 to 3, from 1 to 4, from 1 to 5, from 2 to 4, from 2 to 6, from 3 to 6, and so on, as well as individual numbers within that range, for example, 1, 2, 2.7, 3, 4, 5, 5.3, and 6. This applies regardless of the breadth of the range.

Compositions

The invention provides a microdevice or nanodevice obtained according to the methods of the invention. In certain embodiments, the microdevice or nanodevice comprises at least one ultra-thin layer.

The microdevice or nanodevice of the invention can be prepared according to any of the methods of the invention. Each and every embodiment described as relating to a method of the invention is equally envisioned for a microdevice or nanodevice of the invention. Each and every embodiment described as relating to a microdevice or nanodevice of the invention is equally envisioned for a method of the invention.

In certain embodiments, the invention provides a microdevice or nanodevice comprising an exposed solid material layer that has an approximately uniform thickness of ≤50 nm. In other embodiments, the invention provides a microdevice or nanodevice comprising an exposed solid material layer that has an approximately uniform length or width of ≥1 m.

In certain embodiments, the microdevice or nanodevice is an absorbing mechanism for a microbolometer. In other embodiments, the microdevice or nanodevice is a bolometer, transducer, temperature sensor, heater, thermistor, microbolometer, microphone, speaker, ultrasonic transducer, resistor, inductor, spiral inductor, mechanical actuator, flagellum, flagellum motor, freestanding nanodevice, freestanding microdevice, Bragg reflector, Bragg filter, antenna, terahertz detector, electromagnetic transformer, or electrical system. In yet other embodiments, the microdevice or nanodevice is a transistor, via, conduit, and any other electrical circuit components, Josephson junction, superconducting device, electrical conductor, photovoltaic, transistor, diode, waveguide, electrical transmission line, light emitting diode, thermocouple, mirror, absorber for photons (infrared, terahertz, x-ray, gamma-ray, ultraviolet, visible light), photon emitter (infrared, terahertz, x-ray, gamma-ray, ultraviolet, visible light), radiation shield (electromagnetic or ionizing), or radiation detector (electromagnetic or ionizing). In yet other embodiments, the microdevice or nanodevice is a nanotube, nanowire, coaxial wire, hollow tube with nanoscale diameters, periodic structure, or metamaterial.

In certain embodiments, the bolometer of the invention has low thermal time constant, such as, in a non-limiting example, ≤10 ms. In other embodiments, the bolometer of the invention has sheet resistance about ≤150 ohm/sq. In yet other embodiments, the bolometer of the invention has curl about ≤250 nm.

In certain embodiments, the bolometer of the invention comprises an anchored structure comprising a laminate structure, which comprises a bottom dielectric layer, a middle conductor layer, and a top dielectric layer. In other embodiments, the bottom dielectric layer has a thickness of ≤50 or ≤30 or ≤10 Ångstroms. In yet other embodiments, the bottom dielectric layer comprises $Al_2O_3$. In yet other embodiments, the middle conductor layer has a thickness of ≤250 Ångstroms. In yet other embodiments, the middle conductor layer comprises W and/or Ru and/or graphene. In yet other embodiments, the top dielectric layer has a thickness of ≤50 or ≤30 or ≤10 Ångstroms. In yet other embodiments, the top dielectric layer comprises $Al_2O_3$.

In certain embodiments, the bolometer of the invention comprises a leg structure comprising a laminate structure, which comprises a bottom dielectric layer, a middle conductor layer, and a top dielectric layer. In other embodiments, the bottom dielectric layer has a thickness of ≤50 or ≤30 or ≤10 Ångstroms. In yet other embodiments, the bottom dielectric layer comprises $Al_2O_3$. In yet other embodiments, the middle conductor layer has a thickness of ≤50 or ≤30 or ≤10 Ångstroms. In yet other embodiments, the middle conductor layer has a thickness of ≤250 Ångstroms. In yet other embodiments, the middle conductor layer comprises Ti and/or Ru. In yet other embodiments, the top dielectric layer has a thickness of ≤50 or ≤30 or ≤10 Ångstroms. In yet other embodiments, the top dielectric layer comprises $Al_2O_3$.

In certain embodiments, the bolometer of the invention comprises a transducing element structure comprising a laminate structure, which comprises a bottom dielectric layer, a middle transducer layer, and a top dielectric layer. In other embodiments, the bottom dielectric layer has a thickness of ≤50 or ≤30 or ≤10 Ångstroms. In yet other embodiments, the bottom dielectric layer comprises $Al_2O_3$. In yet other embodiments, the middle transducer layer has a thickness of ≤1500 or ≤750 or ≤350 Ångstroms. In yet other embodiments, the middle transducer layer has a thickness of ≤2,500 Ångstroms. In yet other embodiments, the middle transducer layer comprises $VO_x$. In yet other embodiments, the top dielectric layer has a thickness of ≤50 or ≤30 or ≤10 Ångstroms. In yet other embodiments, the top dielectric layer comprises $Al_2O_3$.

Methods

The invention provides a method of generating a microdevice or nanodevice (micro/nanodevice) comprising a first solid material layer. In certain embodiments, the method comprises providing a solid supporting material layer, wherein at least a portion of a surface of the solid supporting material layer is attached to a first solid material layer. In other embodiments, the method comprises performing ALE on at least one exposed surface of the first solid material layer.

In certain embodiments, the micro/nanodevice's first solid material layer has an approximately uniform thickness of ≤50 nm. In other embodiments, the thickness is selected from the group consisting of ≤40 nm, ≤30 nm, ≤20 nm, ≤10 nm, ≤8 nm, ≤6 nm, ≤4 nm, ≤2 nm, and ≤1 nm. In yet other embodiments, the micro/nanodevice's first solid material layer has length and width that are independently selected from the group consisting of ≥1 μm, ≥2 μm, ≥4 μm, ≥6 μm, ≥8 μm, ≥10 μm, ≥20 μm, ≥40 μm, ≥60 μm, ≥80 μm, and ≥100 μm.

In certain embodiments, at least a portion of the first solid material layer is fabricated using a procedure selected from the group consisting of ALD, micromachining, MLD, reactive ion beam deposition, chemical vapor deposition, sputtering, evaporation, sol-gel processing, electroplating, photopolymerization, 3D printing, spin coating, spray coating, contact adhesion, casting, self-assembly, dip-coating, Langmuir-Blodgett deposition, and plasma enhanced chemical vapor deposition.

In certain embodiments, the first solid material layer comprises two or more at least partially overlapping layers. In other embodiments, the first solid material layer comprises three at least partially overlapping layers. In yet other embodiments, at least one of the two or more at least partially overlapping layers is not significantly etched by ALE.

In certain embodiments, at least a portion of the first solid material layer is at least partially attached to the solid supporting material layer through an intervening material layer. In other embodiments, at least one selected from the group consisting of the solid supporting material layer and the intervening material layer is not significantly etched by ALE.

In certain embodiments, the first solid material layer is deposited onto the solid supporting material layer and/or intervening material layer using at least one method selected from the group consisting of ALD, MLD, reactive ion beam deposition, chemical vapor deposition, sputtering, evaporation, sol-gel processing, electroplating, photopolymerization, 3D printing, spin coating, spray coating, contact adhesion, casting, self-assembly, dip-coating, Langmuir-Blodgett deposition, and plasma enhanced chemical vapor deposition.

In certain embodiments, the intervening material layer is deposited onto the solid supporting material layer using at least one method selected from the group consisting of ALD, MLD, reactive ion beam deposition, chemical vapor deposition, sputtering, evaporation, sol-gel processing, electroplating, photopolymerization, 3D printing, spin coating, spray coating, contact adhesion, casting, self-assembly, dip-coating, Langmuir-Blodgett deposition, and plasma enhanced chemical vapor deposition.

In certain embodiments, the first solid material layer comprises at least one material selected from the group consisting of Ag, Al, $Al_2O_3$, Au, Co, Cu, Fe, GaN, Ge, $GeO_2$, $HfO_2$, indium tin oxide, Ir, Mo, Ni, Pd, Pt, Rh, Ru, Ru, $RuO_2$, Si, SiC, SiGe, $SiO_2$, $SnO_2$, Ta, Ti, TiN, $TiO_2$, $V_2O_5$, $VO_x$, W, ZnO, $ZrO_2$, parylene, polyimide, polymethyldisiloxane, polystyrene, polypropylene, poly(methyl methacrylate), polyethylene, an epoxy, and poly(vinyl chloride).

In certain embodiments, the nanodevice or microdevice is at least partially freestanding. In other embodiments, at least a portion of the intervening solid material layer is further removed. In yet other embodiments, upon removal of at least a portion of the intervening solid material layer, at least a portion of the ALE-treated first solid material layer does not contact (is suspended over) the solid supporting material layer.

In certain embodiments, before ALE is performed on at least one exposed surface of the first solid material layer, the method comprises (a) masking at least a portion of the exposed surface of the first solid material layer. In other embodiments, before ALE is performed on at least one exposed surface of the first solid material layer, the method comprises coating the exposed surface of the first solid material layer with an atomic layer etching (ALE)-resistant material, and then etching the ALE-resistant material, so as to expose at least a portion of the surface of the first solid material layer. In yet other embodiments, the etching is anisotropic.

In certain embodiments, the solid supporting material layer comprises Si, $SiO_2$, SiGe, Pyrex, $Si_3N_4$, sapphire, GaAs, SiC, a metal, an insulator, a semiconductor, or a solid organic material (e.g. polyimide). In other embodiments, the solid supporting material layer is a wafer. In yet other embodiments, the wafer comprises Si, $SiO_2$, SiGe, Pyrex, $Si_3N_4$, sapphire, GaAs, SiC, a metal, an insulator, a semiconductor, or a solid organic material.

In certain embodiments, the masking comprises at least one selected from the group consisting of photolithography, e-beam lithography, nanoimprint lithography, x-ray lithography, a hard mask comprising an organic material, and a hard mask comprising an inorganic material layer. In other embodiments, the masking or anisotropic etching allows for the ALE to form a cavity within the first solid material layer. In yet other embodiments, the masking exposes a section of the surface of the first solid material layer.

In certain embodiments, ALE is performed to form a cavity that is located on the surface of the exposed first solid material layer and is approximately hemi-spherical. In other embodiments, removal of at least a portion of the intervening solid material layer forms a curved surface in the nanodevice or microdevice. In yet other embodiments, the anisotropic etching creates an indentation within the first solid material layer. In yet other embodiments, the surface of the indentation is further partially coated with an ALE-resistant material, such that at least a portion of the surface of the indentation is exposed. In yet other embodiments, ALE is performed to form a cavity that is located within the first solid material layer and is approximately spherical. In yet other embodiments, the ALE-treated first solid material layer is further coated. In yet other embodiments, the coating is performed using at least one method selected from the group consisting of ALD, MLD, reactive ion beam deposition, chemical vapor deposition, sputtering, evaporation, sol-gel processing, electroplating, photopolymerization, 3D printing, spray coating, contact adhesion, casting, self-assembly, dip-coating, Langmuir-Blodgett deposition, and plasma enhanced vapor deposition.

In certain embodiments, the first solid material layer comprises a first metal-containing material. In other embodiments, the ALE comprises (a) contacting the exposed first solid material layer with a gaseous second metal-containing precursor, wherein the second metal-containing precursor comprises at least one ligand selected from the group consisting of a monodentate ligand, chelate and any combinations thereof, whereby a first metal-containing precursor is formed. In yet other embodiments, the ALE comprises (b) contacting the material formed in step (a) with a halogen-containing gas, whereby a first metal halide is formed. In yet other embodiments, the ALE comprises (c) optionally repeating steps (a) and (b) one or more times. In yet other embodiments, in at least one time point selected from the group consisting of: during step (a), inbetween step (a) and step (b), during step (b), and inbetween step (b) and step (a) of the following iteration, the exposed first solid material layer is treated with an agent that promotes removal of at least a fraction of any ligand, or any residual surface species that results from a surface reaction, that is bound to and/or adsorbed onto the exposed first solid material layer.

In certain embodiments, the monodentate ligand comprises at least one selected from the group consisting of alkyl, hydride, carbonyl, halide, alkoxide, alkylamide, silylamide and any combinations thereof. In other embodiments, the chelate comprises at least one selected from the group consisting of β-diketonate, amidinate, acetamidinate, β-diketiminate, diamino alkoxide, metallocene and any combinations thereof.

In certain embodiments, step (a) and/or step (b) is/are performed at a temperature that is equal to or greater than a value ranging from about 25° C. to about 450° C. In other embodiments, the gaseous compound of the second metal in step (a) and the halogen-containing gas in step (b) are contained in separate systems, and the nanodevice or microdevice is physically moved from one system to the other.

In certain embodiments, the first metal-containing material comprises at least one selected from the group consisting of metal oxide, metal nitride, metal phosphide, metal sulfide, metal arsenide, metal fluoride, metal silicide, metal boride, metal carbide, metal selenide, metal telluride, elemental metal, metal alloy, hybrid organic-inorganic material, and any combinations thereof. In other embodiments, before step (a) takes place, the elemental metal is converted to the corresponding metal halide.

In certain embodiments, the exposed first solid material layer is first submitted to a chemical treatment that results in the formation, on at least a portion of the surface of the exposed first solid material layer, of a metal-containing material selected from the group consisting of a metal oxide, metal nitride, metal phosphide, metal sulfide, metal arsenide, metal fluoride, metal silicide, metal boride, metal carbide, metal selenide, metal telluride, elemental metal, metal alloy, hybrid organic-inorganic material, and any combinations thereof.

In certain embodiments, the first metal comprises at least one selected from the group consisting of Al, Hf, Zr, Fe, Ni, Co, Mn, Mg, Rh, Ru, Cr, Si, Ti, Ga, In, Zn, Pb, Ge, Ta, Cu, W, Mo, Pt, Cd, Sn and any combinations thereof. In other embodiments, the second metal comprises at least one selected from the group consisting of Sn, Ge, Al, B, Ga, In, Zn, Ni, Pb, Si, S, P, Hf, Zr, Ti and any combinations thereof.

In certain embodiments, the β-diketonate comprises at least one selected from the group consisting of acac (acetylacetonate), hfac (hexafluoroacetylacetonate), tfac (trifluoroacetylacetonate), thd (tetramethylheptanedionate) and any combinations thereof.

In certain embodiments, the halogen-containing gas comprises a hydrogen halide. In other embodiments, the hydrogen halide comprises HF, HCl, HBr or HI.

In certain embodiments, the halogen-containing gas comprises at least one selected from the group consisting of $F_2$, $ClF_3$, $NF_3$, $SF_6$, $SF_4$, $XeF_2$, $Cl_2$, $Br_2$, $BCl_3$, $I_2$ and any combinations thereof. In other embodiments, the halogen-containing gas comprises at least one selected from the group consisting of $F_2$, $ClF_3$, $NF_3$, $SF_6$, $SF_4$, $XeF_2$, $Cl_2$, $Br_2$, $BCl_3$, $I_2$, $CF_4$, $CF_2Cl_2$, $CCl_4$, $CF_3Cl$, $C_2F_6$, $CHF_3$ and any combinations thereof, and wherein the halogen-containing gas is ionized in a plasma to produce at least one halogen radical and/or ion. In yet other embodiments, the halogen-containing gas is ionized in a plasma to produce at least one halogen radical and/or ion.

In certain embodiments, the exposed first solid material layer is pretreated by sequentially contacting with a gaseous second metal-containing precursor, and a halogen-containing gas.

In certain embodiments, the invention provides methods of smoothing surfaces using ALE, as well as provides surfaces that are smooth by virtue of the use of ALE. Smoothing of surfaces is of interest in the semiconductor industry. Smoothing may be used to obtain damage-free layers. Sputtering can be used to remove some materials, but can leave a rough, damaged surface. ALE can be used to remove the damaged layer and smooth the surface to produce a "damage-free surface."

Surface smoothing can also be used to obtain very high quality ultrathin films. For example, high quality ultrathin films can be produced by a "deposit/etch back" strategy by depositing a thicker film and then etching back to a thinner film. In a non-limiting embodiment, nucleation effects can lead to roughness in the ultrathin deposited film; once a continuous and pinhole-free thicker film is formed, ALE can etch this film back and obtain a smoother surface than would have been produced by growing to this ultrathin thickness.

In certain embodiments, ALE can be used to reduce the feature size of 3D architectures. The gas phase, isotropic and/or anisotropic etching obtained using thermal ALE or enhanced thermal ALE can reduce feature sizes and mass conformally with atomic level precision versus the number of ALE reaction cycles. Applications include reducing the width of FinFET channels in MOSFET structures and reducing the diameter and mass of nanowires and quantum dots.

Every formulation or combination of components described or exemplified can be used to practice the invention, unless otherwise stated. Specific names of compounds are intended to be exemplary, as it is known that one of ordinary skill in the art can name the same compounds differently. When a compound is described herein such that a particular isomer or enantiomer of the compound is not specified, for example, in a formula or in a chemical name, that description is intended to include each isomer and/or enantiomer of the compound described individual or in any combination. Although the description herein contains many embodiments, these should not be construed as limiting the scope of the invention but as merely providing illustrations of some of the presently preferred embodiments of the invention.

Those skilled in the art will recognize, or be able to ascertain using no more than routine experimentation, numerous equivalents to the specific procedures, embodiments, claims, and examples described herein. Such equivalents are considered to be within the scope of this invention and covered by the claims appended hereto. For example, it should be understood, that modifications in reaction conditions, including but not limited to reaction times, reaction temperature and pressure, reaction size/volume, and experimental reagents with art-recognized alternatives and using no more than routine experimentation, are within the scope of the present application. In general the terms and phrases used herein have their art-recognized meaning, which can be found by reference to standard texts, journal references and contexts known to those skilled in the art. Any preceding definitions are provided to clarify their specific use in the context of the invention.

The following examples further illustrate aspects of the present invention. However, they are in no way a limitation of the teachings or disclosure of the present invention as set forth herein.

EXAMPLES

The invention is now described with reference to the following Examples. These Examples are provided for the purpose of illustration only, and the invention is not limited to these Examples, but rather encompasses all variations that are evident as a result of the teachings provided herein.

Example 1: Suspended MicroBridge Structures

Figure 2A:
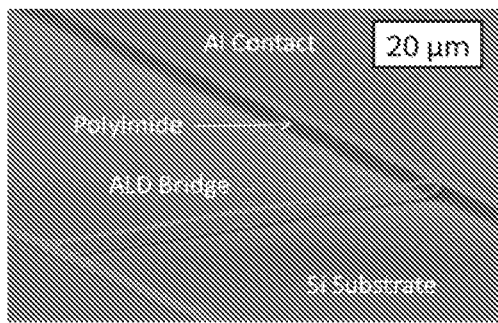
FIGS. 2A-2B illustrate ultra-thin ALD test structures.

Suspended microbridge test structures were fabricated using thermal ALE (FIG. 2A). A sacrificial polyimide layer was spun onto a bare silicon wafer to a thickness of about 3 µm and cured. Next, ALD layers were deposited using a Beneq TFS 200 ALD reactor. The layers were deposited at 300° C. in a trilayer configuration consisting of 6.15 nm $Al_2O_3$/3.7 nm Ru/6.15 nm $Al_2O_3$. The $Al_2O_3$ was deposited using TMA and $H_2O$ precursors for growth at about 0.13 nm/cycle. The Ru was deposited using thermally activated Ru(EtCp)$_2$ (bis(ethylcyclopentyldienyl)ruthenium(II)) at 110° C. and $O_2$ for growth at about 0.04 nm/cycle. The ALD layers were then patterned using a positive photoresist mask and a $CF_4/O_2$ reactive ion etch chemistry. Next, using a negative photoresist lift off process, Al was evaporated to form contact pads at the anchors of the microbridges. Finally, an $O_2$ plasma ashing process was used to remove the sacrificial polyimide layer and release the microbridges. The microbridges are on the order of 20-120 μm in length and 2-4 μm in width.

Figure 2B:
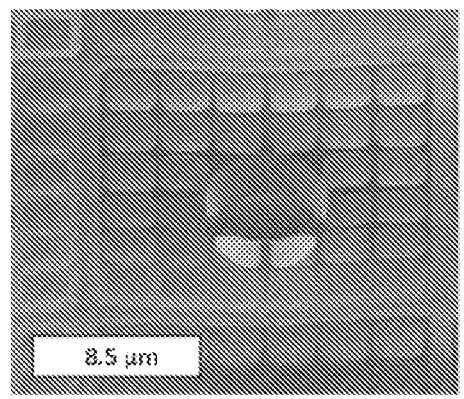

Microbolometer-type absorption structures (FIG. 2B) were fabricated in a similar process as described above with the absence of Al contact pads. The layers were produced in a custom ALD W reactor and consisted of a nominal $Al_2O_3/W/Al_2O_3$ trilayer, which produces flat suspended absorption structures. The $Al_2O_3$ deposition was performed at 130° C. for growth at about 0.13 nm/cycle. The W deposition was performed at 130° C. for growth at about 0.38 nm/cycle.

Methods

Figure 3A:
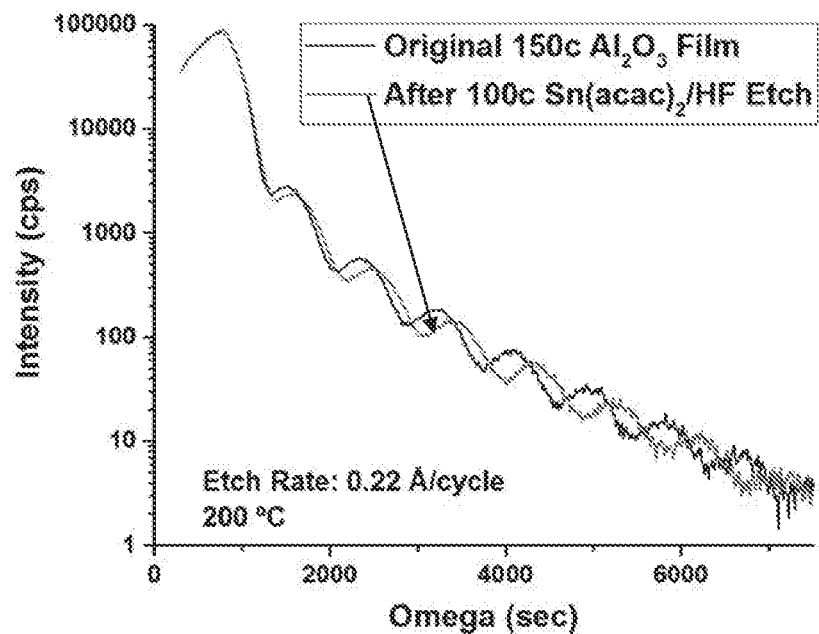
FIGS. 3A-3B illustrate X-ray reflectivity (XRR) data for thermal ALE of $Al_2O_3$ using $Sn(acac)_2$/HF and TMA/HF chemistries. Differences in the periodicity for pre- and post-ALE correspond to varied X-ray interference due to changes in the film thickness.
Figure 3B:
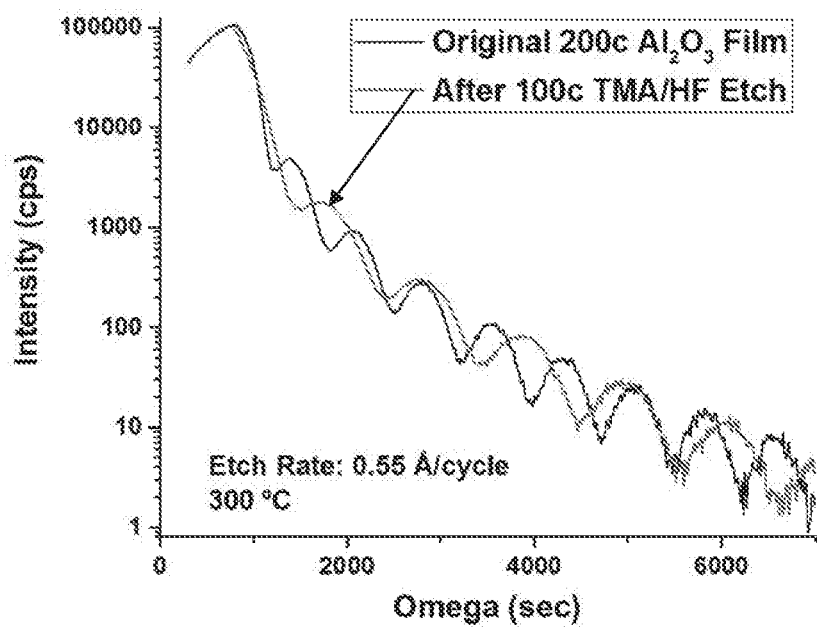

Two thermal ALE chemistries etch $Al_2O_3$ using a fluorination and ligand exchange mechanism. $Sn(acac)_2/HF$ and TMA/HF etch $Al_2O_3$ in a self-limiting process. FIGS. 3A-3B demonstrate X-ray reflectivity data from $Al_2O_3$ coated Si test wafers, providing etch rates. Etching using $Sn(acac)_2/HF$ was performed at 200° C. with an etch rate of about 0.022 nm/cycle. Etching using TMA/HF was performed at 300° C. with an etch rate of about 0.055 nm/cycle. Special attention was paid to precursor dose pressure and purge times to ensure surface saturation and self-limited behavior. Etch rates are subject to change with varied reactor parameters. For example, the $Sn(acac)_2/HF$ etch rate was increased to about 0.046 nm/cycle by varying dose pressures.

Micropulse calorimetry was used to measure material removal on suspended microbridge test structures. This method was previously used to measure the specific heat capacity of ALD W (Eigenfeld, et al., 2015, Transducers 2015, IEEE, Anchorage, Ak., pp. 1385-1388). The thermal time constants, τ's, of the microbridge test structures are measured before and after ALE sessions. A pulsed step voltage is applied across the bridge (with a rise time <1 μs) and a transient current response is monitored, which is several orders of magnitude slower than the voltage rise. This effect is a result of the temperature sensitive resistance responding to Joule heating of the Ru and surrounding $Al_2O_3$ layers. An exponential decay function can be fit to the measured current response to extract τ for a given microbridge length. The experimental τ data can then be fit to extract the thermal diffusivity, α, where τ is given as:

$$\tau = \alpha \cdot l^2/\pi^2$$

where l is the microbridge length and α is given as, $$\alpha = \kappa/\rho \cdot c_p$$

where κ is the thermal conductivity, ρ is the density and $c_p$ is the specific heat capacity of the microbridge. To compare the measured time constant data to calculations using the expected thickness removal during ALE processing, κ and ρ of the microbridges pre- and post-ALE were measured following the methods outlined by Eigenfeld, et al., 2015, Nanoscale 7(42): 17923-17928. The microbridges were Joule-heated using a steady-state biasing technique and κ extracted using a temperature dependent resistance Joule heating model. The thicknesses and densities of the pre-ALE ALD films were also measured using X-ray reflectometry (XRR) on a Bede D1 X-ray diffractometer. The X-ray wavelength for measurements was 1.54 Å, corresponding to the Ka transition in the Cu X-ray tube. The Bede REFS software was used to fit the XRR data and extract the thickness and densities of the ALD $Al_2O_3$ and Ru films. Using the measured κ and ρ and bulk $c_p$ values, the measured thermal diffusivity, $\alpha_{exp}$, may be compared with the calculated thermal diffusivity, $\alpha_{calc}$, based on a relative thicknesses of Ru and $Al_2O_3$ contributions given as, $$\alpha_{calc} = (\alpha_{Ru} \cdot \tau_{Ru} + \alpha_{Al2O3} \cdot \tau_{Al2O3})/(\tau_{Ru} + \tau_{Al2O3})$$

where t is the thickness of the Ru or $Al_2O_3$ layers.

Results

Figure 4:
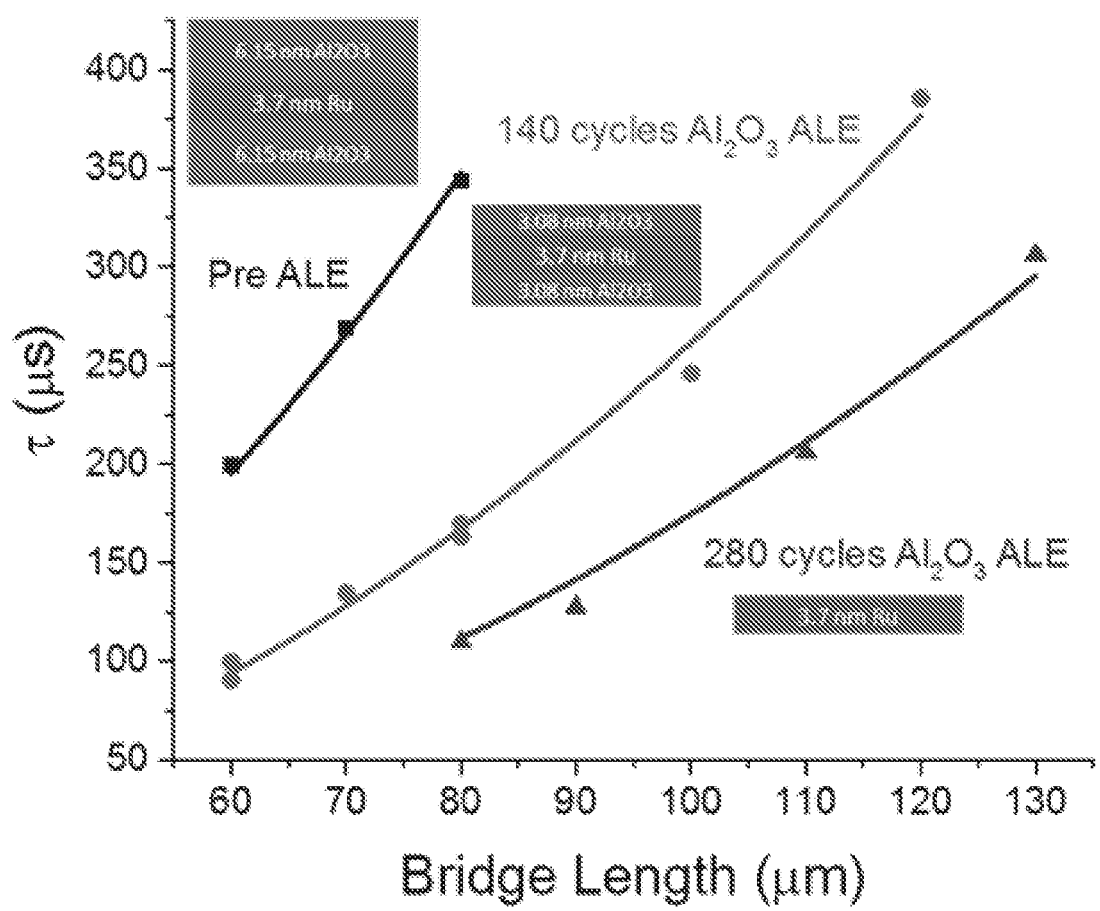
FIG. 4 illustrates the finding that ALE reduces thermal time constants of microbridges by material removal. After 140 cycles of ALE, about half of the total $Al_2O_3$ thickness was removed. After 280 cycles of ALE, all of the $Al_2O_3$ thickness was removed leaving just Ru. Curve fits correspond to the extraction of thermal diffusivity (left to right: shown in black, red, and blue).

The τ's of several lengths of the $Al_2O_3/Ru/Al_2O_3$ test structures were measured pre-ALE and then etched using the $Sn(acac)_2/HF$ chemistry. FIG. 4 demonstrates pre and post ALE etching with $Sn(acac)_2/HF$. After each ALE session, the thermal time constants of the microbridges are reduced as $Al_2O_3$ is removed in increments of 140 and 280 $Sn(acac)_2/HF$ cycles (FIG. 4). Using equation 1, α was extracted (FIG. 4 fit lines) for pre- and post-ALE sessions. Using measured κ, ρ, and bulk specific heat capacity, $\alpha_{calc}$ for the first 140 ALE cycles (middle curve, FIG. 4) using an expected 3.1 nm top and bottom $Al_2O_3$ etch falls within 13% of $\alpha_{exp}$. For 280 ALE cycles, $\alpha_{calc}$ does not agree well with $\alpha_{exp}$, likely due to complete removal of the $Al_2O_3$ and oxidation of the bare Ru structure upon transfer from the ALE vacuum system to the electrical probing vacuum system. Sources of error include slight variations in etch rates between the top and underside $Al_2O_3$ surfaces or the global etch rate due to reactor parameters. It is possible longer precursor exposure would reduce such error to ensure complete underside surface saturation for each ALE cycle. A notable increase in resistance of the Ru microbridges was observed after being exposed to atmosphere for several days.

The microbolometer-type absorption structures were subject to both etch chemistries to remove about 3.1 nm of $Al_2O_3$ on top and bottom of the structure. The $Sn(acac)_2/HF$ chemistry was repeated for 67 cycles at the elevated etch rate of 0.046 nm/cycle, and the TMA/HF chemistry repeated for 51 cycles at the typical etch rate. Additionally, the suspended structures were subjected to the etch duration and the given etch temperature with no ALE processing to determine if they would survive at elevated temperature for the etch duration and remain flat (FIGS. 5A-5D). The structures remained flat after being subject to both 200° C. and 300° C. for 16 hours with no ALE processing. After 67 cycles of ALE processing with $Sn(acac)_2/HF$, the structure yielded negligible curling. After 51 cycles of ALE with TMA/HF, processing also yielded negligible curling.

Figure 6:
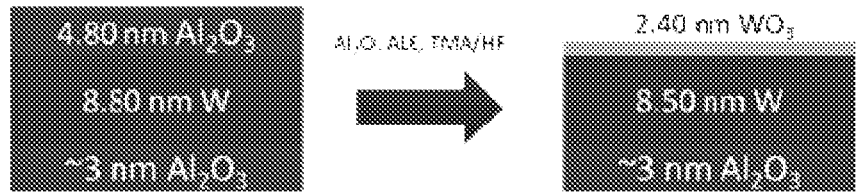
FIG. 6 illustrates ALE selectivity results for TMA/HF for $Al_2O_3$ and W. XRR results show that the top layer of $Al_2O_3$ was completely etched after a 10% overetch and an expected layer of native $WO_3$ formed.
Figure 6:
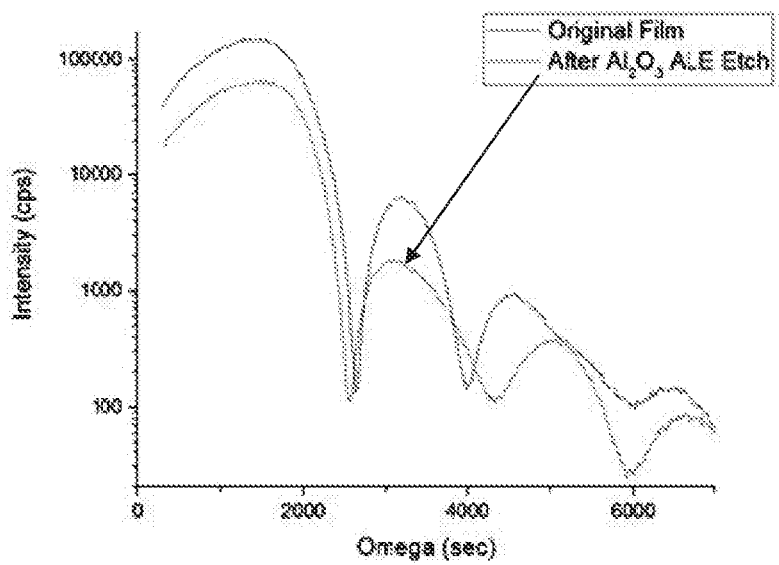

To confirm the exposed metal sidewalls of the microbridge test structures and microbolometer-type suspended structures were not etched during the above experiments, each etching chemistry was tested for selectivity to $Al_2O_3$ in the presence of Ru and W. The top $Al_2O_3$ layer in a trilayer of ALD $Al_2O_3/Ru/Al_2O_3$ on Si was etched using $Sn(acac)_2/HF$ at 200° C., and the top $Al_2O_3$ layer in a trilayer of ALD $Al_2O_3/W/Al_2O_3$ on Si was etched using $Sn(acac)_2/HF$ at 200° C. and TMA/HF at 300° C. For each etch, $Al_2O_3$ was removed completely, with a 10% overetch based on its thickness and ALE etch rate. The trilayer thicknesses and densities were measured using XRR pre- and post-ALE to determine if the Ru and W films were affected by the ALE chemistries during etch exposure. FIG. 6 demonstrates the results of the selectivity etch experiment for $Al_2O_3/W/Al_2O_3$ using TMA/HF. After etching the top $Al_2O_3$ layer, a thin native metal oxide layer in the form of $WO_3$ or $RuO_2$ was formed after exposure to atmosphere during XRR on the order of a few nanometers. Using thickness and density calculations for oxide growth, the measured metal oxide thicknesses via XRR correspond to the expected oxide growth for an un-etched metal film. FIG. 6 demonstrates this result for TMA/HF at 300° C. in the presence of $Al_2O_3$ and W. Similar results were achieved for Sn(acac)$_2$/HF at 200° C. in the presence of Al$_2$O$_3$/W and Al$_2$O$_3$/Ru.

As described herein, the first ever demonstration of thermal ALE on suspended NEMS structures was demonstrated using Sn(acac)$_2$/HF and TMA/HF chemistries. Etching Al$_2$O$_3$ conformally on the top and underside of microbridge test structures was confirmed using micropulse calorimetry. Etching of microbolometer-type absorption structures to reduce thermal mass and maintain a flat suspended structure was achieved using TMA/HF. The Sn(acac)$_2$/HF and TMA/HF chemistries were selective to Al$_2$O$_3$ in the presence of ALD W and ALD Ru. The concept of conformal isotropic etching of suspended NEMS structure can be applied to a variety of niche fabrication processes for future devices. ALE of a diverse subset of materials opens unique avenues for microdevice and nanodevice fabrication.

Example 2: Nanotubes/Nanowires/Coaxial Wires

Figure 7:
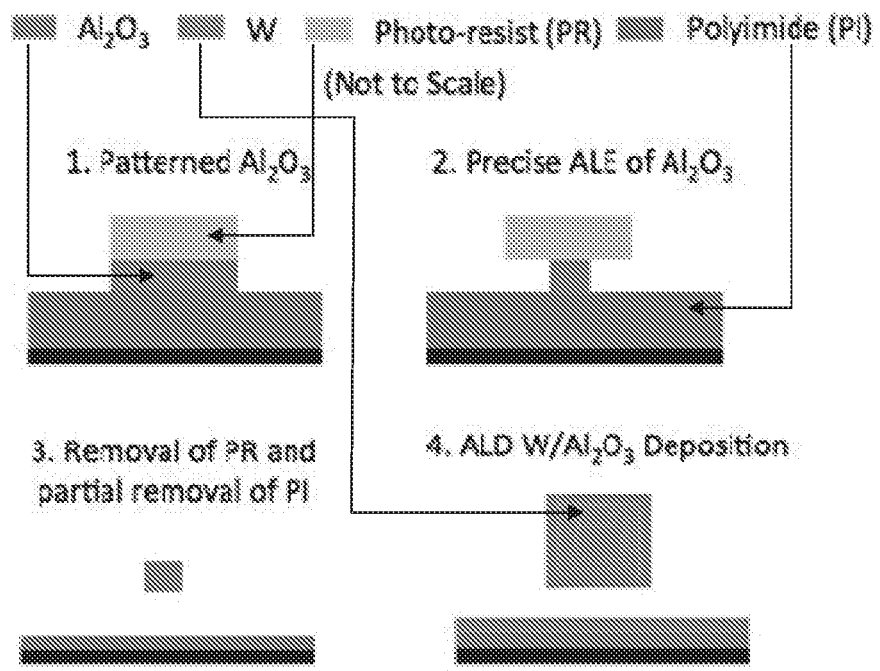
FIG. 7 illustrates an example of a lithography process using ALE to create $Al_2O_3$ nanowires (step 3) or W nanotubes with an $Al_2O_3$ core and shell (step 4).

One application of ALE for N/MEMS is the fabrication of nanotubes or nanowires (FIG. 7). For example, a patterned alumina (Al$_2$O$_3$) layer on top of polyimide can be further thinned under photoresist allowing for Angstrom-controlled etching of structures less than tens of nanometers. After release of the structure, a suspended Al$_2$O$_3$ nanowire can be created. Further film deposition, including, but not limited to, atomic layer deposition (ALD) of tungsten (W) on this suspended nanowire can create W nanotubes with an Al$_2$O$_3$ core. Capping the W layer with Al$_2$O$_3$ ALD is a non-limiting effective method of preventing W oxidation.

Example 3: Micro/Nano Bowls or Wine Glass Structures

Figure 8:
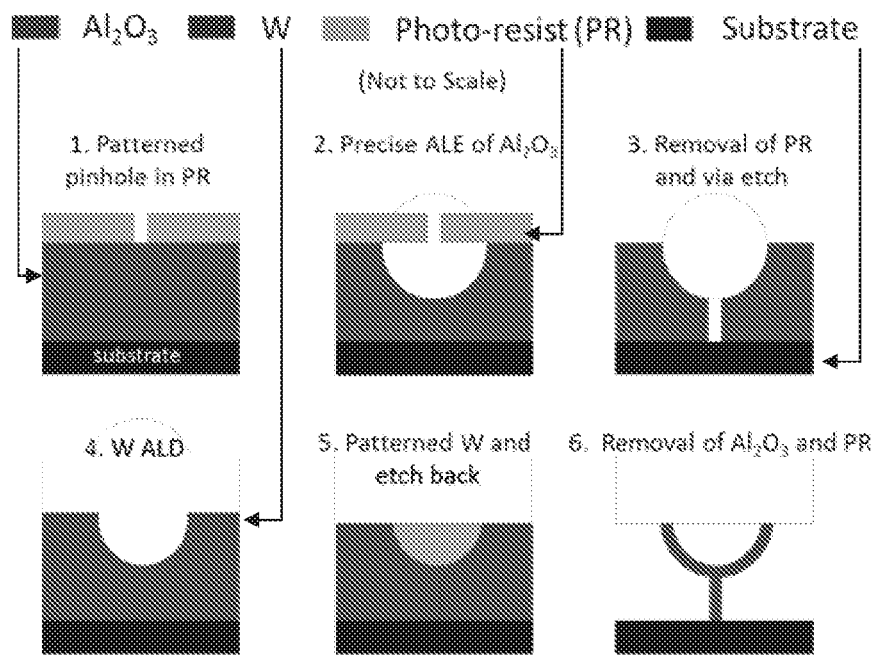
FIG. 8 illustrates an example of how ALE can be used to make micro/nano bowls (step 2) or wineglass structures (step 6) out of a W ALD film.

Another application for ALE on N/MEMS is the fabrication of micro/nano bowls (FIG. 8). One method of creating these structures is by starting with a patterned pinhole on top of a material to be etched by thermal ALE. Since thermal ALE is an isotropic etch process, etching through the pinhole creates a uniform semi-sphere in the etched material. Removal of the photoresist then leaves a bowl structure behind. The dimensions of these bowls can be easily tuned with Angstrom level control. After the bowl is completed, another film can be deposited into the bowl, such as one using an ALD process. Using a patterned photoresist to protect only the film inside the bowl, the film outside the bowl can be etched away. Another etch process can then remove the underlying bowl material, leaving only a suspended bowl film of thickness determined by the bowl ALD layer.

Example 4: Acoustic or Optical Waveguides-Suspended Tube Structures

Figure 9:
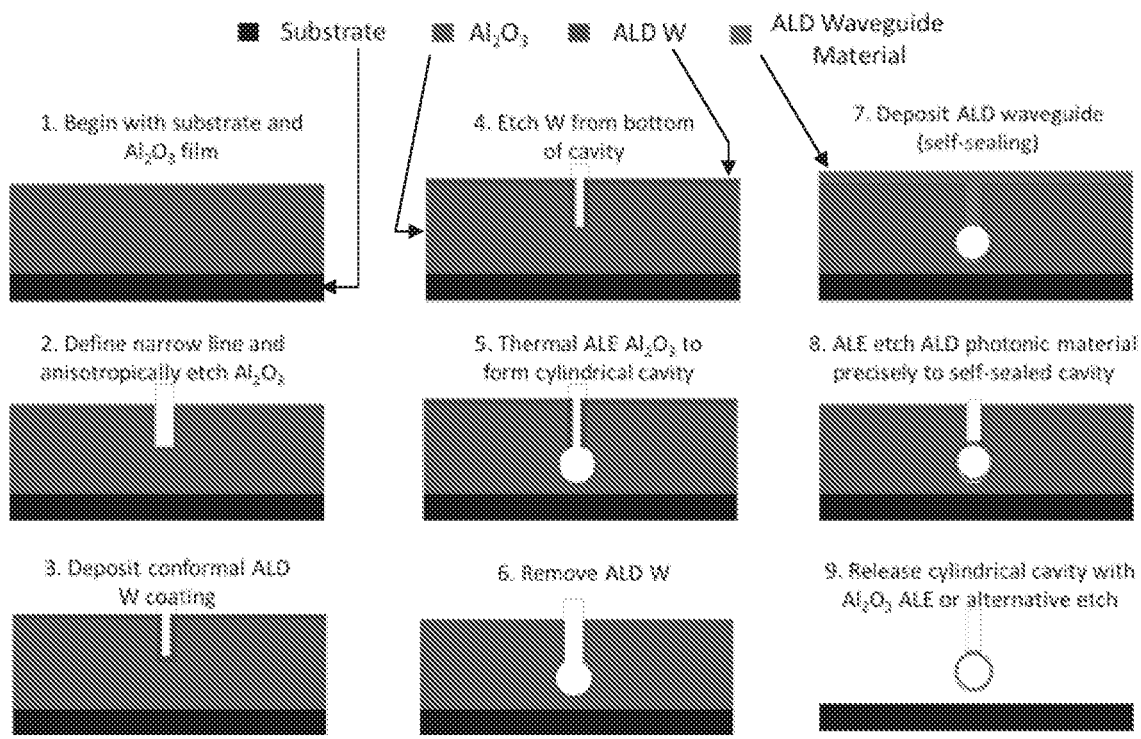
FIG. 9 illustrates an example of how thermal ALE can be used to isotropically etch and precisely define molds for suspended tube-like structures for waveguide applications. Current methods for thermal ALE of $Al_2O_3$ are selective in the presence of ALD W. The ALD waveguide material may include, but is not limited to, ALD W.
Figure 10:
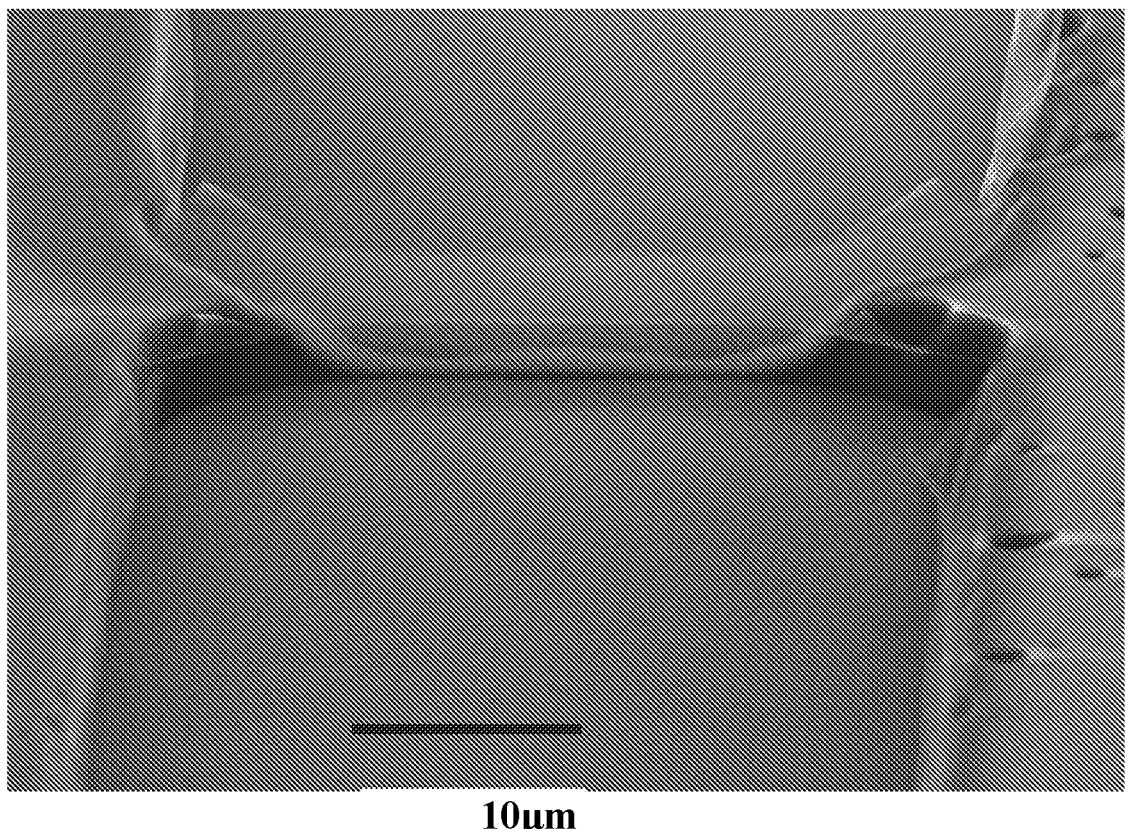
FIG. 10 illustrates an ultra-thin 2.5 nm $Al_2O_3$ suspended structure etched using TMA/HF ALE at 200° C. The beams are 4 μm (top) and 2 μm (bottom) in width with lengths from about 10-80 μm. In the bottom figure, the red line (single line, on top) corresponds to the centerline of a suspended beam, while the blue lines (double lines, on bottom) correspond to the edges of a suspended beam.
Figure 10:
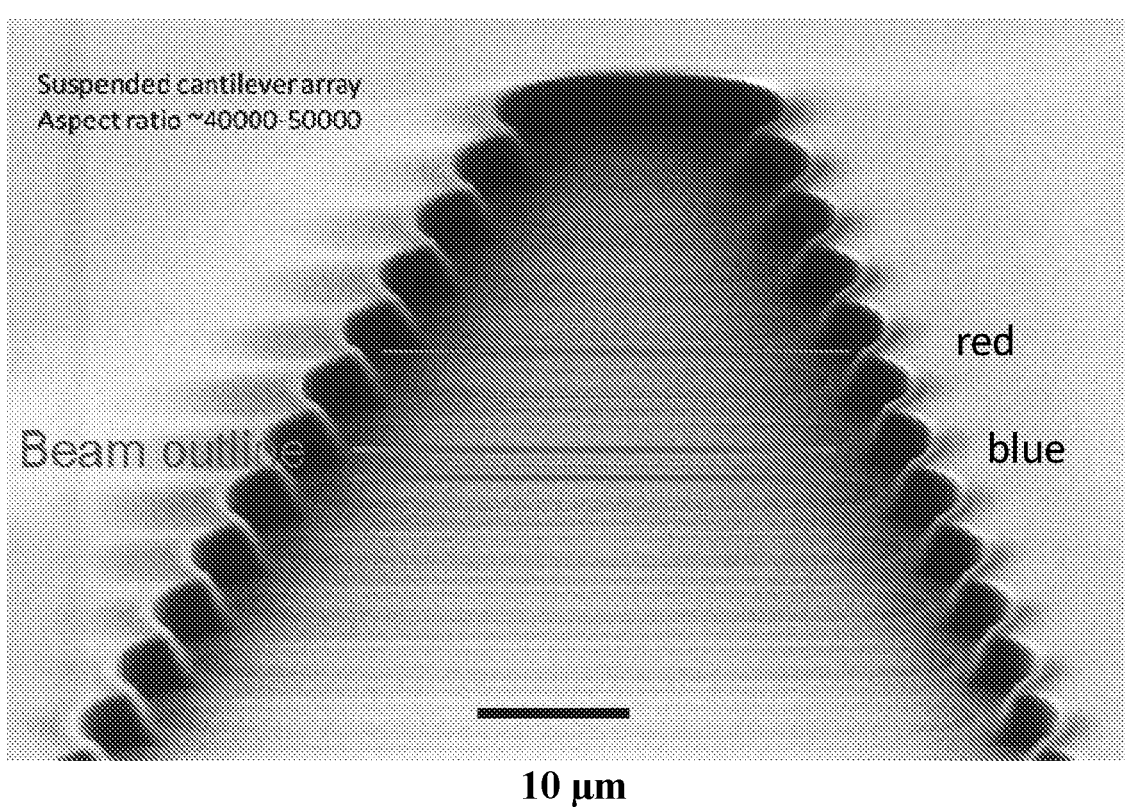

One application of ALE is in the fabrication of suspended tube-like structures for waveguide applications. Suspended waveguides result in lower losses to the substrate. By using ALD Al$_2$O$_3$ or another material which can be etched using thermal ALE, as a sacrificial etch layer, thermal ALE can be used to precisely define a cylindrical cavity due to its conformal and isotropic properties (FIG. 9, step 5). A desired ALD waveguide material can then be deposited conformally to coat the precisely defined cavity. Another ALE etch can be used to precisely remove the material in the stem of the cylindrical cavity (FIG. 9, step 8). These structures can be anchored or tethered to the underlying substrate and complex networks formed for potential photonic or acoustic waveguide applications.

Example 5: Precise Etching of Ultra-Thin Layers

As described elsewhere herein, a precise etch of ultra-thin layers can be achieved with no need for significant over-etching. Over-etching can cause damage to underlying layers, which can be crucial for final device performance. In this example, 2.5 nm of Al$_2$O$_3$ is etched into cantilever patterns on polyimide and the polyimide removed in an O$_2$ ashing process to suspend ultrathin Al$_2$O$_3$ structures.

Example 6: Microbolometer

The present invention can be applied to a microbolometer device, which is a nano-electromechanical system. The generalizations provided herein can be easily be extended to a broad range of N/MEMS devices.

Microbolometer Umbrella (Anchored) Structure, Support Leg Structure and Transducing Structure:

The creation of highly sensitive infrared (IR) detectors allows for a host of imaging applications in industrial, military, and commercial applications, including, but not limited to: monitoring of facilities and machinery; aerial surveillance; night vision; automotive collision avoidance; weapon detection; non-invasive medical imaging; water resource management; energy audits, petroleum and chemical safety monitoring.

At present, IR imagers encompass two categories of operation, photoconductive and thermal. Photoconductive detectors, such as Quantum Well Infrared Photodetectors or photodiode devices, are considered single stage transducers. They operate on the immediate electrical detection of individual photon interactions with a material lattice. These devices require sufficient cooling for operation, making them bulky and cost ineffective. Uncooled thermal detectors, or two stage transducers, have emerged as the dominant technology for marketable IR imaging, operating on the conversion of IR radiation to detectable heat. These devices include microbolometers, pyroelectrics, thermopiles and Golay cells. The microbolometer device emerged as the market leader for its ease of fabrication, large format compatibility and extreme sensitivity with the help of modern CMOS circuitry.

A micro-bolometer pixel structure comprises three components: an absorbing element, thermally isolating supporting element, and transducing element. The transducing element is a resistive structure for which minute changes in temperature, caused by thermal energy transfer from absorbed radiation by the absorber, result in minute changes of the transducer's resistance. In order to maximize this effect, the absorber should be designed to absorb as much incident infrared radiation as possible. This is achieved by material choice, as well as mechanical design of the pixel. A reflective layer is often deposited at the substrate level to enable a normally deconstructive optical absorbance cavity to maximize IR absorption in the absorber. The supporting element comprises an electro-thermal pathway to the underlying substrate. In certain embodiments, it is designed to reduce thermal loss, while also allowing a low electrical resistance connection to the transducing element.

Conventional bolometer absorber structures comprise layers that support and protect a resistive thin metal at ≥50 Ångstrom-thick optimized to absorb almost all incident radiation. The combination of materials in the laminate structure makes up a thermal mass, which experiences a temperature rise relative to the percentage of absorbed radiation converted to thermal energy. Often, the supporting and protective layers for the metal absorber are many orders of magnitude thicker than the metal, resulting in a very large thermal mass. This constricts transducer's speed of response to absorbed radiation resulting in performance loss for the pixel. One solution to reducing the absorber's thermal mass is to introduce channels or insets that reduce the overall amount of material in the absorber.

Additionally, these thick support and protection layers in the absorber are often made of $SiO_2$, a material with unwanted infrared reflective and absorption properties. This effect is magnified by the thickness of the layer and ultimately interferes with the optical cavity formed by the absorber and reflector layer to maximize absorption. This can result in a loss of absorbed IR power and limit the device's sensitivity. Therefore, there is a need for thinner supporting and protective layers in the absorption structure that allow for a substantial increase in the pixel's speed of response to incident radiation. Additionally, these layers should have minimal IR optical interference to enhance the pixel's total IR absorption and therefore sensitivity.

Conventional bolometer support leg structures comprises layers that support and protect a conductive metal at ≥50 Ångstrom thickness. The purpose of the metal layer is to electrically connect an underlying read-out integrated circuit (ROIC) to the transducing element in the suspended bolometer. Often, the supporting and protective layers for the conductive metal are several orders of magnitude thicker than the metal resulting in a large thermal mass. This constrains the bolometer's speed of response to absorbed radiation resulting in a performance loss of the pixel.

These thick support and protection layers in the support leg are also often made of $SiO_2$, a material with unwanted IR reflective and absorption properties. Again, this effect is magnified by the thickness of the layer and ultimately interferes with the optical cavity formed by the absorber and reflector layer to maximize absorption. This can result in a loss of absorbed IR power and limit the device's sensitivity. Therefore, there is a need for thinner supporting and protective layers in the support leg structure that will allow for a substantial increase in the bolometer's speed of response to incident radiation. Additionally, these layers should have minimal IR optical interference to enhance the pixel's total IR absorption and therefore sensitivity.

Conventional bolometer transducing elements consist of materials with a high temperature coefficient of resistance (TCR), usually in the 2-3%/K range. Often $VO_x$ or α-Si are used as transducing materials. However, during the fabrication process of the bolometer unit, a thick dielectric etch stop layer is often utilized during the transducing material patterning and etch step. Again, this additional material is extra thermal mass and does not serve an active bolometer material. Therefore, there is a need for a thinner etch stop/protective bottom layer for the transducing element of the bolometer unit to further improve bolometer performance.

Micro-Bolometer Freestanding Absorber Structure:

The present invention allows for the preparation of a bolometer device with an absorption structure comprising ≤30 or ≤10 Angstrom-thick supporting and protection layers aims to reduce the device's total thermal mass.

Figure 11:
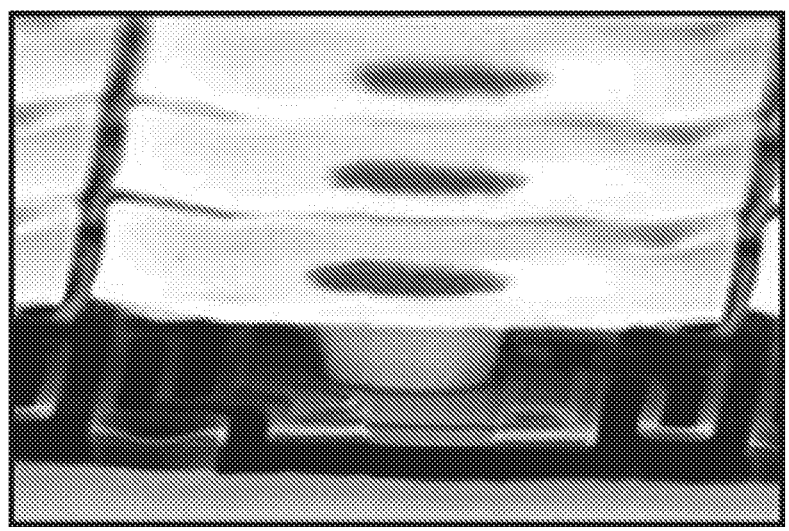
FIG. 11 illustrates baseline 17 μm "umbrella" (anchored) pixels.

A non-limiting example of an absorbing structure for a microbolometer comprises an umbrella-like structure made up of atomic layer deposited materials. This freestanding absorber structure is spaced apart, but anchored to an underlying transducer, which is spaced apart, but anchored to the underlying ROIC (FIG. 11). The freestanding absorber can be fabricated by use of an ALD on polyimide method (see U.S. Patent Application Publication No. US20150212276, which is incorporated herein in its entirety by reference). Specifically, the freestanding absorber contains support and protection layers, which are thinner than the resistive metal absorber to reduce the overall thermal mass resulting in a faster speed of response for the bolometer.

The present invention enables further performance enhancement in microbolometers. The fabricated device can be further improved by using thermal ALE on the freestanding absorber structure to thin the dielectric layers to ≤30 or ≤10 Ångstrom thicknesses (FIG. 5). Such thicknesses are difficult or impossible to achieve directly by ALD during the standard fabrication process or by other conventional deposition or etching processes. At ≤30 or ≤10 Ångstrom thicknesses, the contribution of the dielectric layers to the overall heat capacity is very small or almost negligible, yet the active metal absorber layer remains protected from oxidization.

In accordance with the previously described methods of bolometer performance improvement, a bolometer with an absorption structure consisting of ≤30 Ångstrom or ≤10 Ångstrom thick metal absorption layer has a reduced total thermal mass as compared to the bolometers of the prior art.

In certain embodiments, the invention enables a higher performance microbolometer by utilizing a "deposit and etch back" technique on the active metal absorber. Because films grown to ultra-thin (≤50 nm) thicknesses often have a large portion of their resistance attributed to electron scattering at grain boundaries and film surfaces, the resistivity is often much higher than the bulk value. By using metal ALE it is possible to "deposit and etch back" a film to ultra-thin thickness while smoothing the film roughness. The thicker film formed during deposition has larger grain structures that reduce grain boundary scattering. When ALE is performed, the film is naturally smoothed, because the isotropic and self-limiting etch removes surface topography features equally from all angles. The final film has minimal grain boundary and film surface scattering. Thus, an optimal electrical sheet resistance for LWIR absorption can be achieved at thinner thicknesses, further improving the performance of the overall bolometer unit.

Micro-Bolometer Support Leg Structure:

The present invention allows for preparation of a bolometer with a support leg structure comprising ≤10 Angstrom thick supporting and protection layers for the metal conductor, which reduces the bolometer's total thermal mass.

A non-limiting example of a support leg structure for a micro-bolometer comprises serpentine-like arm comprising atomic layer deposited materials. FIG. 11 illustrates a complete "umbrella" type pixel wherein the support leg structures are fabricated using non-ALD thin film deposition methods. This structure is spaced apart, but anchored to an underlying ROIC and supports the transducing and absorbing elements of the pixel structure. In this non-limiting example, the support leg is fabricated using an ALD on polyimide method (see U.S. Patent Application Publication No. US20150212276, which is incorporated herein in its entirety by reference) to incorporate ultra-thin support and protection layers as well as a conductive metal for electrical connection from underlying circuitry of the ROIC to the pixel transducer. The support and protection layers are thinner than the conductive metal absorber to reduce the overall thermal mass, resulting in a faster speed of response for the bolometer.

The present invention further provides a high-performance microbolometer, wherein thermal ALE is used on the suspended support leg structure to thin the dielectric layers to ≤30 or ≤10 Ångstrom thicknesses. Such thicknesses are difficult or impossible to achieve directly by ALD during the standard fabrication process or by other conventional deposition or etching processes. At ≤30 or ≤10 Ångstrom thicknesses, the contribution of the dielectric layers to the overall heat capacity is very small or almost negligible, yet the active metal leg conduction layer remains protected from oxidization. Following the previously discussed methods of bolometer performance improvement, a bolometer with a support leg structure comprising ≤30 or ≤10 Ångstrom thick metal conduction layer has a reduced total thermal mass as compared to the bolometers of the prior art.

The present invention further provides a high-performance microbolometer, which is prepared using a "deposit and etch back" technique on the active metal support leg conductor. Since films grown to ultra-thin thicknesses often have a large portion of their resistance attributed to electron scattering at grain boundaries and film surfaces, the resistivity is often much higher than the bulk value. By using metal ALE it is possible to "deposit and etch back" a film to ultra-thin thickness, while also being ultra-smooth. The thicker film formed during deposition has larger grain structures, which reduce grain boundary scattering. When ALE is performed, the film is naturally smoothed, because the isotropic and self-limiting etch removes surface topography features equally from all angles. In certain embodiments, the final film has minimal grain boundary and film surface scattering. Thus, an optimal electrical sheet resistance for providing electrical contact to the transducing element can be achieved at thinner thickness, further improving the performance of the overall bolometer unit.

Micro-Bolometer Transducing Element:

The present invention allows for the preparation of a bolometer with a transducing element consisting of ≤30 or ≤10 Ångstrom thick supporting layer for the transducing element, which reduces the bolometer's total thermal mass.

Currently a thick supporting layer is required to provide enough material to safely protect the underlying materials during the transducing element patterning and etch step. To reduce this layer thickness, the transducing material etch should be as precise as possible. Current etching technologies lack atomic precision and thus thick etch stop layers are required during fabrication.

The present invention provides a high-performance microbolometer, wherein selective ALE process for etching the transducing material is used. By using selective ALE to etch the transducing material, there is no requirement for a thick underlying etch stop. This allows the overall thermal mass of the bolometer unit to be reduced and its performance to be enhanced.

In accordance with the previously described methods of bolometer performance improvement, a bolometer with a transducing element comprising ≤100 or ≤300 or ≤500 Ångstrom thick transducing material has a reduced total thermal mass as compared to bolometers of the prior art.

The present invention provides a high-performance microbolometer, which is prepared using a "deposit, anneal and etch back" technique on the active transducing material. Since films grown to ultra-thin thicknesses often are amorphous or have a large portion of their electrical resistance attributed to electron scattering at grain boundaries and film surfaces, the resistivity is often much higher than the bulk value. In certain embodiments, a post-deposition annealing step is utilized to promote crystallization or grain growth in the thin film to provide preferred electrical properties. In the case of the bolometer transducing element, properties such as high TCR, low resistivity and low 1/f noise are desirable. However, for ultra-thin films, this post-deposition annealing step is often damaging to the film wherein agglomeration or pin-hole formation ensues. By using selective ALE for the transducing material, it is possible to "deposit, anneal and etch back" a film to ultra-thin thickness while also being ultra-smooth during and after the isotropic ALE step. The annealed thick film formed has an improved crystalline and grain structure, promoting the desired physical properties of high TCR, low resistivity and low 1/f noise. Producing an ultra-thin transducing material with similar performance to the thicker version of the material offers further performance enhancement of the bolometer unit by a continued reduction in thermal mass.

Micro-Bolometer Thin Etch Stop Layers:

In accordance with the previously described methods of using ALE to make thin etch stop layers, the application to microbolometers is specifically stated. For any and all microbolometer layers requiring an etch, the underlying layer can be made thin if the ALE is selective to the underlying layer and not the remaining layers. The underlying protective layer of the transducing element can be made thin if selective ALE is applied to the transducing element layer, which selectively etches the transducing element layer but does not etch the underlying protective layer. The transducing layer's top protective layer can be made thin if it is etched with ALE selective to that top protective layer and does not etch the transducer layer. The leg conductive layer can be etched with selective ALE while its underlying layer is not etched with selective ALE.

The disclosures of each and every patent, patent application, and publication cited herein are hereby incorporated herein by reference in their entirety.

While the invention has been disclosed with reference to specific embodiments, it is apparent that other embodiments and variations of this invention may be devised by others skilled in the art without departing from the true spirit and scope of the invention. The appended claims are intended to be construed to include all such embodiments and equivalent variations.

What is claimed is:

1. A method of generating a microdevice or nanodevice (micro/nanodevice), the method comprising:
   providing a sacrificial layer and a device layer,
      wherein a first portion of the device layer is not in contact with the sacrificial layer and a second portion of the device layer is in contact with the sacrificial layer;
      wherein the first portion of the device layer comprises at least a top and an underside; and
   performing:
      i) thermal atomic layer etching (ALE) on the at least top and underside of the first portion of the device layer; or
      ii) thermal ALE on the sacrificial layer;
   wherein, before ALE is performed on at least one exposed surface of the device layer, at least one of the following is performed:
   (a) masking at least a portion of the exposed surface of the device layer;
   (b) coating the exposed surface of the device layer with an atomic layer etching (ALE)-resistant material, and then etching the ALE-resistant material, so as to expose at least a portion of the surface of the device layer, wherein the etching is optionally anisotropic; and generating the micro/nanodevice comprising the device layer.

2. The method of claim 1, wherein at least one applies:
(a) the micro/nanodevice's device layer has a thickness of ≤50 nm;
(b) wherein the micro/nanodevice's device layer has length and width that are independently selected from the group consisting of ≥1 µm, ≥2 µm, ≥4 µm, ≥6 µm, ≥8 µm, ≥10 µm, ≥20 µm, ≥40 µm, ≥60 µm, ≥80 µm, and ≥100 µm.

3. The method of claim 1, wherein at least a portion of the device layer is fabricated using a procedure selected from the group consisting of atomic layer deposit (ALD), micromachining, molecular layer deposition (MLD), reactive ion beam deposition, chemical vapor deposition, sputtering, evaporation, sol-gel processing, electroplating, photopolymerization, three-dimensional (3D) printing, spin coating, spray coating, contact adhesion, casting, self-assembly, dip-coating, Langmuir-Blodgett deposition, and plasma enhanced chemical vapor deposition.

4. The method of claim 1, wherein the device layer comprises two or more at least partially overlapping layers, optionally wherein at least one of the two or more at least partially overlapping layers is not significantly etched by ALE.

5. The method of claim 1, wherein at least one applies:
(a) the microdevice or nanodevice is an absorbing mechanism for a microbolometer;
(b) the nanodevice or microdevice is at least partially freestanding.

6. The method of claim 1, wherein at least a portion of the device layer is at least partially attached to the sacrificial layer through an intervening material layer,
optionally wherein at least one selected from the group consisting of the sacrificial layer and the intervening material layer is not significantly etched by ALE,
wherein at least one selected from the group consisting of the device layer and the intervening material is deposited onto the sacrificial layer or intervening material layer using at least one method selected from the group consisting of ALD, MLD, reactive ion beam deposition, chemical vapor deposition, sputtering, evaporation, sol-gel processing, electroplating, photopolymerization, 3D printing, spin coating, spray coating, contact adhesion, casting, self-assembly, dip-coating, Langmuir-Blodgett deposition, and plasma enhanced chemical vapor deposition.

7. The method of claim 1, wherein the device layer comprises at least one material selected from the group consisting of Ag, Al, $Al_2O_3$, Au, Co, Cu, Fe, GaN, Ge, $GeO_2$, $HfO_2$, indium tin oxide, Ir, Mo, Ni, Pd, Pt, Rh, Ru, Ru, $RuO_2$, Si, SiC, SiGe, $SiO_2$, $SnO_2$, Ta, Ti, TiN, $TiO_2$, $V_2O_5$, $VO_x$, W, ZnO, $ZrO_2$, parylene, polyimide, polymethyldisiloxane, polystyrene, polypropylene, poly(methyl methacrylate), polyethylene, an epoxy, and poly(vinyl chloride).

8. The method of claim 1, wherein the sacrificial layer comprises Si, $SiO_2$, SiGe, Pyrex, $Si_3N_4$, sapphire, GaAs, SiC, a metal, an insulator, a semiconductor, or a solid organic material, and optionally wherein the sacrificial layer is a wafer.

9. The method of claim 1, wherein the masking comprises at least one selected from the group consisting of photolithography, electron-beam (e-beam) lithography, nanoimprint lithography, x-ray lithography, a hard mask comprising an organic material, and a hard mask comprising an inorganic material layer.

10. The method of claim 1, wherein the ALE-treated device layer is further coated.

11. The method of claim 1, wherein the device layer comprises a first metal-containing material and wherein the ALE comprises:
(a) contacting the exposed device layer with a gaseous second metal-containing precursor, wherein the second metal-containing precursor comprises at least one ligand selected from the group consisting of a monodentate ligand, chelate and combinations thereof, whereby a first metal-containing precursor is formed;
(b) contacting the material formed in step (a) with a halogen-containing gas, whereby a first metal halide is formed; and
(c) optionally repeating steps (a) and (b) one or more times;
wherein, in at least one time point selected from the group consisting of: during step (a), in between step (a) and step (b), during step (b), and in between step (b) and step (a) of the following iteration, the exposed device layer is treated with an agent that promotes removal of at least a fraction of any ligand, or any residual surface species that results from a surface reaction, that is bound to or adsorbed onto the exposed device layer;
wherein the monodentate ligand comprises at least one selected from the group consisting of alkyl, hydride, carbonyl, halide, alkoxide, alkylamide, silylamide and combinations thereof; and,
wherein the chelate comprises at least one selected from the group consisting of β-diketonate, amidinate, acetamidinate, β-diketiminate, diamino alkoxide, metallocene and combinations thereof.

12. The method of claim 11, wherein at least one selected from the group consisting of step (a) and step (b) is performed at a temperature that is equal to or greater than a value ranging from about 25° C. to about 450° C.

13. The method of claim 11, wherein the first metal-containing material comprises at least one selected from the group consisting of metal oxide, metal nitride, metal phosphide, metal sulfide, metal arsenide, metal fluoride, metal silicide, metal boride, metal carbide, metal selenide, metal telluride, elemental metal, metal alloy, hybrid organic-inorganic material, and combinations thereof; optionally wherein, before step (a) takes place, the elemental metal is converted to the corresponding metal halide.

14. The method of claim 11, wherein the exposed device layer is first submitted to a chemical treatment that results in the formation, on at least a portion of the surface of the exposed device layer, of a metal-containing material selected from the group consisting of a metal oxide, metal nitride, metal phosphide, metal sulfide, metal arsenide, metal fluoride, metal silicide, metal boride, metal carbide, metal selenide, metal telluride, elemental metal, metal alloy, hybrid organic-inorganic material, and combinations thereof.

15. The method of claim 11, wherein at least one applies:
the first metal comprises at least one selected from the group consisting of Al, Hf, Zr, Fe, Ni, Co, Mn, Mg, Rh, Ru, Cr, Si, Ti, Ga, In, Zn, Pb, Ge, Ta, Cu, W, Mo, Pt, Cd, Sn, and combinations thereof;
the second metal comprises at least one selected from the group consisting of Sn, Ge, Al, B, Ga, In, Zn, Ni, Pb, Si, S, P, Hf, Zr, Ti and combinations thereof.

16. The method of claim 11, wherein at least one applies:
(a) the β-diketonate comprises at least one selected from the group consisting of acac (acetylacetonate), hfac (hexafluoroacetylacetonate), tfac (trifluroacetylacetonate), thd (tetramethylheptanedionate) and combinations thereof;
(b) the halogen-containing gas comprises a hydrogen halide;
(c) the halogen-containing gas comprises at least one selected from the group consisting of $F_2$, $ClF_3$, $NF_3$, $SF_6$, $SF_4$, $XeF_2$, $Cl_2$, $Br_2$, $BCl_3$, $I_2$ and combinations thereof;
(d) the halogen-containing gas comprises at least one selected from the group consisting of $F_2$, $ClF_3$, $NF_3$, $SF_6$, $SF_4$, $XeF_2$, $Cl_2$, $Br_2$, $BCl_3$, $I_2$, $CF_4$, $CF_2Cl_2$, $CCl_4$, $CF_3Cl$, $C_2F_6$, $CHF_3$ and combinations thereof, and wherein the halogen-containing gas is ionized in a plasma to produce at least one halogen radical or ion.

17. The method of claim 11, wherein the exposed device layer is pretreated by sequentially contacting with a gaseous second metal-containing precursor, and a halogen-containing gas.

* * * * *

UNITED STATES PATENT AND TRADEMARK OFFICE
CERTIFICATE OF CORRECTION

| | | |
|---|---|---|
| PATENT NO. | : 11,565,936 B2 | Page 1 of 1 |
| APPLICATION NO. | : 16/303612 | |
| DATED | : January 31, 2023 | |
| INVENTOR(S) | : George et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 925 days.

Signed and Sealed this
Thirty-first Day of December, 2024

Derrick Brent
*Acting Director of the United States Patent and Trademark Office*